(12) United States Patent
Utsuzawa et al.

(10) Patent No.: US 11,091,997 B2
(45) Date of Patent: Aug. 17, 2021

(54) ESTIMATING NUCLEAR MAGNETIC RESONANCE MEASUREMENT QUALITY

(71) Applicant: Schlumberger Technology Corporation, Sugar Land, TX (US)

(72) Inventors: Shin Utsuzawa, Arlington, MA (US); Wei Chen, Spring, TX (US); Martin D. Hurlimann, Newton, MA (US); Antoine Marcel Benard, Sugar Land, TX (US); Vasileios Varveropoulos, Katy, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 438 days.

(21) Appl. No.: 15/775,212

(22) PCT Filed: Oct. 18, 2016

(86) PCT No.: PCT/US2016/057440
§ 371 (c)(1),
(2) Date: May 10, 2018

(87) PCT Pub. No.: WO2017/083060
PCT Pub. Date: May 18, 2017

(65) Prior Publication Data
US 2020/0291763 A1 Sep. 17, 2020

Related U.S. Application Data

(60) Provisional application No. 62/254,052, filed on Nov. 11, 2015.

(51) Int. Cl.
*E21B 44/02* (2006.01)
*E21B 49/00* (2006.01)
*G01V 3/32* (2006.01)

(52) U.S. Cl.
CPC ............ *E21B 44/02* (2013.01); *E21B 49/003* (2013.01); *G01V 3/32* (2013.01); *E21B 2200/20* (2020.05)

(58) Field of Classification Search
CPC ...... E21B 44/02; E21B 49/03; E21B 2200/20; G01V 3/32
(Continued)

(56) References Cited

U.S. PATENT DOCUMENTS 6,246,236 B1  6/2001  Poitzsch et al.
6,437,564 B1  8/2002  Itskovich et al.
(Continued)

FOREIGN PATENT DOCUMENTS

WO   WO2015031149 A1   3/2015
WO      2015070874 A1   5/2015
(Continued)

OTHER PUBLICATIONS

International Search Report and Written Opinion issued in International Patent application PCT/US2016/057440 dated Jan. 26, 2017. 17 pages.
(Continued)

*Primary Examiner* — Taras P Bemko

(57) ABSTRACT

A system for drilling a borehole is disclosed. The system may include drill string having a bottom hole assembly a nuclear magnetic resonance tool within the bottom hole assembly, and a surface control system including a nuclear magnetic resonance measurement quality map. The control system may be configured to drill a borehole at a first set of drilling parameters and to receive motion properties from the nuclear magnetic resonance tool and adjust the drilling of the bore hole at a second set of drilling parameters. The surface control system may be further configured to adjust the drilling of the bore hole based on the motion properties
(Continued)

from the nuclear magnetic resonance tool and the nuclear magnetic resonance measurement quality map.

12 Claims, 22 Drawing Sheets

(58) Field of Classification Search
USPC .......................................................... 175/27
See application file for complete search history.

(56) References Cited

U.S. PATENT DOCUMENTS

| | | |
|---|---|---|
| 6,459,263 B2 | 10/2002 | Hawkes et al. |
| 6,492,809 B1 | 12/2002 | Speier et al. |
| 6,566,874 B1 | 5/2003 | Speier et al. |
| 6,975,112 B2 | 12/2005 | Morys et al. |
| 7,268,547 B2 | 9/2007 | Kruspe et al. |
| 2001/0045892 A1 | 11/2001 | Thomas et al. |
| 2004/0251898 A1 | 12/2004 | Morys et al. |
| 2007/0222443 A1 | 9/2007 | Blanz |
| 2008/0021654 A1 | 1/2008 | Gillen et al. |
| 2010/0119138 A1 | 5/2010 | Hulbert |
| 2016/0272506 A1* | 9/2016 | Jensen ............... G01N 33/1833 |

FOREIGN PATENT DOCUMENTS

| | | |
|---|---|---|
| WO | 2015088543 A1 | 6/2015 |
| WO | WO2016065962 A1 | 5/2016 |

OTHER PUBLICATIONS

Carr et al., Effects of Diffusion on Free Precession in Nuclear Magnetic Resonance Experiments, Physical Review, vol. 94, No. 3, pp. 630-638, 1954.
Hahn, E. L., Detection of Sea-Water Motion by Nuclear Precession, Journal of Geophysical Research, vol. 65, No. 2, pp. 776-777, 1960.
Benson et al., Profile Amplitude Modulation in Stray-Field Magnetic-Resonance Imaging, Journal of Magnetic Resonance, Series A, vol. 112, pp. 17-23, 1995.
International Preliminary Report on Patentability issued in International Patent application PCT/US2016/057440, dated May 15, 2018, 11 pages.
First Office Action and Search Report issued in Chinese Patent Application 201680068875.2 dated Apr. 16, 2021.
Heider, R., Design and Implementation of a New Magnetic Resonance Tool for the While Drilling Environment, SPWLA 44th Annual Logging Symposium, pp. 1-10, 2003.
Lu et al, Brief Introduction of Key Techniques in NMR Logging While Drilling Tool, Well Logging Technology, vol. 31 No. 2, pp. 107-111, Apr. 2007, contains English Abstract.

* cited by examiner

ESTIMATING NUCLEAR MAGNETIC RESONANCE MEASUREMENT QUALITY

CROSS-REFERENCE TO RELATED APPLICATIONS

This application claims the benefit of priority of U.S. Provisional Application No. 62/254,052 filed Nov. 11, 2015, which is incorporated herein by reference in its entirety.

TECHNICAL FIELD

Some embodiments described herein generally relate to nuclear magnetic resonance measurement and, more specifically, to techniques for estimating nuclear magnetic resonance measurement quality under motion.

BACKGROUND

In the drilling of oil and gas wells, logging-while-drilling tools may be used to measure the properties of the wellbore and the surrounding formation. One such logging-while-drilling tool is a nuclear magnetic resonance tool. A nuclear magnetic resonance well logging tool may be used to measure the properties of nuclear spins in the formation, such as the longitudinal (or spin-lattice) relaxation time (referred to as $T_1$), transverse (or spin-spin) relaxation time (referred to as $T_2$), and diffusion coefficient (D). Knowledge of these nuclear magnetic resonance (NMR) measurement properties can help aid in determination of basic formation properties such as permeability and porosity, as well as the fluid properties such as fluid type and viscosity.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A system for drilling a borehole is disclosed. The system may include a drill string having a bottom hole assembly, a nuclear magnetic resonance tool within the bottom hole assembly, and a surface control system including a nuclear magnetic resonance measurement quality map. The control system may be configured to drill a borehole at a first set of drilling parameters and to receive motion properties from the nuclear magnetic resonance tool and adjust the drilling of the bore hole at a second set of drilling parameters. The surface control system may be further configured to adjust the drilling of the bore hole based on the motion properties from the nuclear magnetic resonance tool and the nuclear magnetic resonance measurement quality map.

A method for mitigating effects of tool motion on a nuclear magnetic resonance measurement is disclosed. The method may include determining an estimate of nuclear magnetic resonance measurement signals as a function of motion of a tool and estimating motion properties of the tool. The method may also include estimating nuclear magnetic resonance measurement quality by correlating the motion properties of the tool and the nuclear magnetic resonance measurement signals. An effect of the motion of the tool on the nuclear magnetic resonance measurement may be mitigated by using the estimated nuclear magnetic resonance measurement quality.

A method of operating a logging-while-drilling system is disclosed. The method may include receiving a plurality of bottom hole assembly configurations. A plurality of drilling parameters may also be received. The method may also include receiving a plurality of formation properties. One or more criteria for nuclear magnetic resonance measurement quality may also be received. The method may also include executing a bottom hole assembly dynamics simulation to estimate a correlation of a motion of a nuclear magnetic resonance tool and an estimated nuclear magnetic resonance measurement quality using one or more of the plurality of bottom hole assembly configurations, one or more of the plurality of drilling parameters; one or more of the plurality of formation properties, and at least one of the one or more criteria for nuclear magnetic resonance measurement quality and determining the estimated nuclear magnetic resonance measurement quality for at least one of the plurality of bottom hole assembly configurations.

BRIEF DESCRIPTION OF THE SEVERAL VIEWS OF THE DRAWINGS

In the drawings, sizes, shapes, and relative positions of elements are not drawn to scale. For example, the shapes of various elements and angles are not drawn to scale, and some of these elements may have been arbitrarily enlarged and positioned to improve drawing legibility.

DETAILED DESCRIPTION

Figure 1:
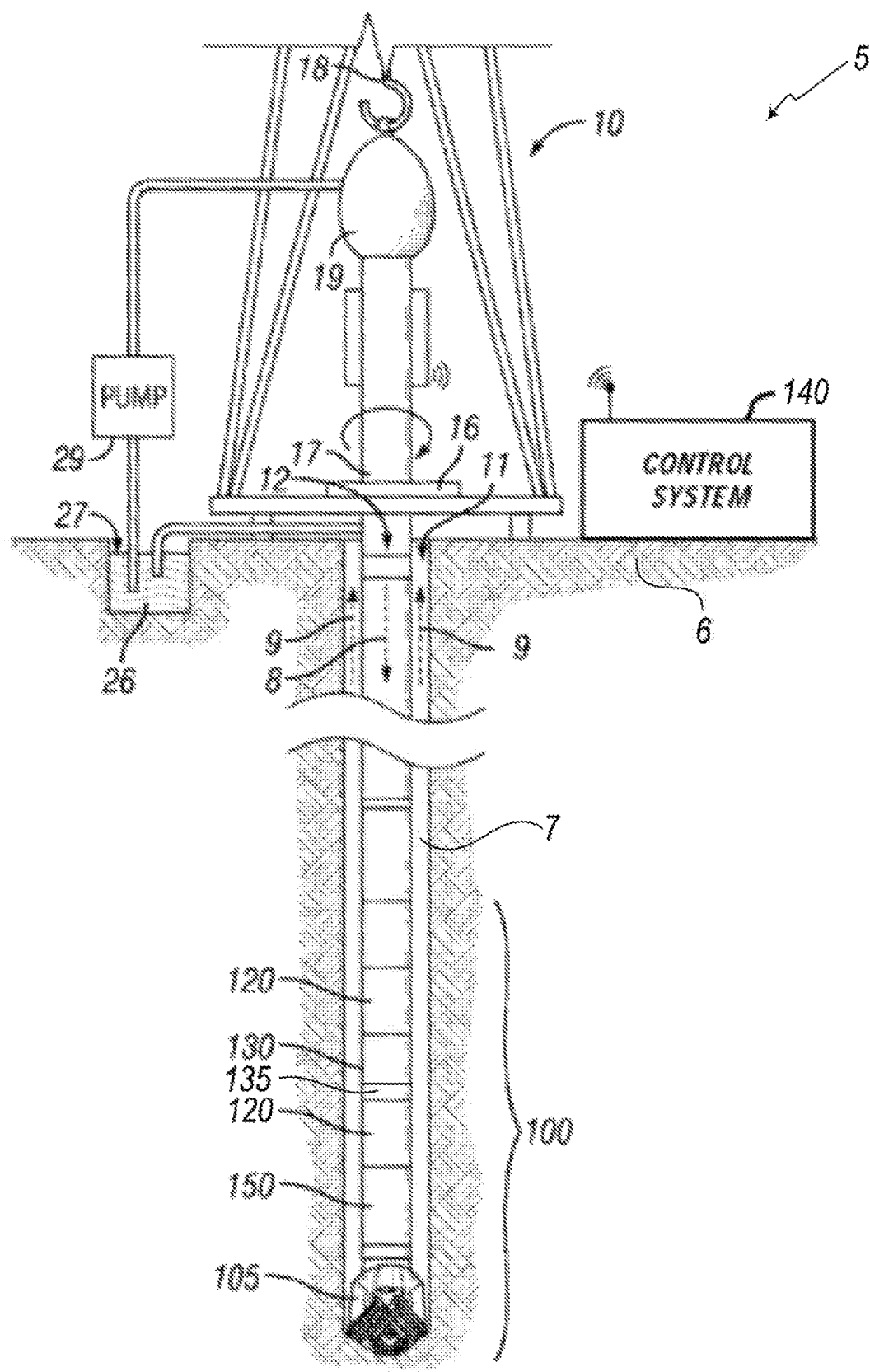
FIG. 1 depicts a schematic diagram of a wellsite system, according to one or more embodiments disclosed herein.

A well site drilling system may be deployed in either onshore or off shore applications. FIG. 1 represents a simplified view of a well site system 5 that is shown in an onshore application. The well site drilling system 5 forms a borehole 11 in a subsurface formation 6 by rotary drilling. Some embodiments may use vertical drilling techniques, some may use directional drilling techniques, and some may use a combination of both techniques.

A drill string 12 is suspended within the borehole 11 and has a bottom hole assembly (BHA) 100 which includes a drill bit 105 at its lower end. The surface system of the well site drilling system 5 includes a platform and derrick assembly 10 positioned over the borehole 11, with the platform and derrick assembly 10 including a rotary table 16, kelly 17, hook 18, and rotary swivel 19. In a drilling operation, the drill string 12 is rotated by the rotary table 16, which engages the kelly 17 at the upper end of the drill string 12. The drill string 12 is suspended from the hook 18, attached to a traveling block, not shown, through the kelly 17 and the rotary swivel 19 which permits rotation of the drill string 12 relative to the hook 18. In some embodiments, a top drive system may be used to rotate the drill string 12.

Drilling fluid or mud 26 may be stored in a pit 27 formed at the well site. A pump 29 delivers the drilling fluid or mud 26 to the interior of the drill string 12 via a port in the swivel 19, which causes the drilling fluid or mud 26 to flow downwardly through the drill string 12, as indicated by the directional arrow 8 in FIG. 1. The drilling fluid exits the drill string 12 via ports in the drill bit 105 or in other parts of the drill string 12, such as a stabilizer, not shown, and then circulates upwardly through the annulus region 7 between the outside of the drill string 12 and the wall of the borehole 11, as indicated by the directional arrows 9. In this way, the drilling fluid lubricates the drill bit 105 and carries formation cuttings up to the surface as it is returned to the pit 27 for recirculation.

The drill string 12 includes the BHA 100. In the illustrated embodiment, the BHA 100 is shown as having one measurement-while-drilling (MWD) tool 130 and multiple logging-while-drilling (LWD) tools 120. As used herein, the term "module" or "tool" as applied to MWD and LWD tools is understood to mean either a single tool or a suite of multiple tools contained in a single modular device. Additionally, the BHA 100 includes a rotary steerable system (RSS) and motor 150 and a drill bit 105.

The LWD tool 120 may be housed in a drill collar and can include one or more types of logging tools. The LWD tool 120 may include capabilities for measuring, processing, and storing information, as well as for communicating with the surface equipment. By way of example, the LWD tool 120 may include a nuclear magnetic resonance (NMR) logging tool, and may include capabilities for measuring, processing, and storing information, and for communicating with surface equipment.

The MWD tool 130 is also housed in a drill collar, and can contain one or more devices for measuring characteristics of the drill string and drill bit. In the present embodiment, the MWD tool 130 can include one or more of the following types of measuring devices: a weight-on-bit measuring device, a torque measuring device, a vibration measuring device, a shock measuring device, a stick/slip measuring device, a direction measuring device, and an inclination measuring device. The MWD tool 130 may include an electrical power generation or storage system 135 for powering the downhole system. Power generated by or stored in the electrical power generation or storage system 135 of the MWD tool 130 may be used to power the MWD tool 130 and the LWD tool 120. In some embodiments, this apparatus may include a mud turbine generator powered by the flow of the drilling fluid 26. It is understood, however, that other power and/or battery systems may be employed.

The operation of the platform and derrick assembly 10 of FIG. 1 may be controlled using control system 140 located at the surface. The control system 140 may include one or more processor-based computing systems. In the present context, a processor may include a microprocessor, programmable logic devices (PLDs), field-gate programmable arrays (FPGAs), application-specific integrated circuits (ASICs), system-on-a-chip processors (SoCs), or any other suitable integrated circuit capable of executing encoded instructions stored, for example, on tangible computer-readable media (e.g., read-only memory, random access memory, a hard drive, optical disk, flash memory, etc.). Such instructions may correspond to, for instance, workflows and the like for carrying out a drilling operation, algorithms and routines for processing data received at the surface from the BHA 100 (e.g., as part of an inversion to obtain one or more desired formation parameters), and so forth.

NMR logging tools, such as the LWD tool 120 of FIG. 1, may use permanent magnets to create a strong static magnetic polarizing field inside the formation. The hydrogen nuclei of water and hydrocarbons are electrically charged spinning protons that create a weak magnetic field, similar to tiny bar magnets. When a strong external magnetic field from the logging tool passes through a formation containing fluids, these spinning protons align themselves like compass needles along the magnetic field. This process, called polarization, increases exponentially with $T_1$ (longitudinal relaxation time), while the external magnetic field (referred to as the $B_0$ field) is applied.

In operation, NMR measurements are obtained by applying a second oscillating magnetic field (referred to as the $B_1$ field) as a series of pulses from an antenna or coils in the NMR tool, which can be followed by or interleaved with data acquisition. These pulses may be based on the Carr-Purcell-Meiboom-Gill (CPMG) pulse sequence or its variants, in which trains of spin echoes are generated by a series of pulses. The pulses cause the aligned protons to tip into a plane perpendicular (transverse) to the direction of the polarization field ($B_0$). These tipped protons start to precess around the direction of the strong logging-tool magnetic field at a frequency called the Larmor frequency.

The precessing protons create an oscillating magnetic field, which generates weak radio signals at this frequency. The total signal amplitude from the precessing hydrogen nuclei (e.g., a few microvolts) is a measure of the total hydrogen content, or porosity, of the formation. The rate at which the precession decays is the transverse relaxation time ($T_2$), which is indicative of the rate at which the spinning protons lose their alignment within the transverse plane. The rate at which the precession decays can depend on certain factors, such as: the intrinsic bulk-relaxation rate in the fluid; the surface-relaxation rate, which is an environmental effect; and relaxation from diffusion in a polarized field gradient, which is a combination of environmental and tool effects.

Additionally, diffusion coefficients (D) can also be measured by applying a set of pulses with variable durations in between to encode the diffusive attenuation in spin echo amplitudes. Further, NMR measurement types can be combined to obtain information regarding the formation and/or the fluids present therein. For instance, $T_2$ and D measurements can be combined to obtain two-dimensional information on formation fluids. In another example, $T_2$ and $T_1$ measurements can be combined as well. In general, any NMR measurements including but not limited to the above examples may be combined to obtain multi-dimensional information on the formation or formation fluids.

Once the desired NMR data is acquired, mathematical inversion processes can be applied to produce the distribution of measured properties that reflects the anisotropy of formation or formation fluids. For example, the $T_2$ distribution represents the distribution of pore sizes within the formation, and the area under the $T_2$ curve represents the porosity filled with formation fluids. Interpretation of pore size distribution and logarithmic mean $T_2$ may be used for calculating various petrophysical parameters, such as permeability and the amount of free/bound fluid.

Complex lateral motion that may be induced during the drilling process can affect NMR measurements. Such motion may have amplitude and frequency spectrums that depend on a number of parameters. For example, the motion can have random and periodic components depending on various parameters, such as weight-on-bit (WOB), rotations per minute (RPM) (or per other unit of time, e.g., seconds), stabilizer size, torque-on-bit (TOB), and/or borehole inclination, among others.

Figure 3:
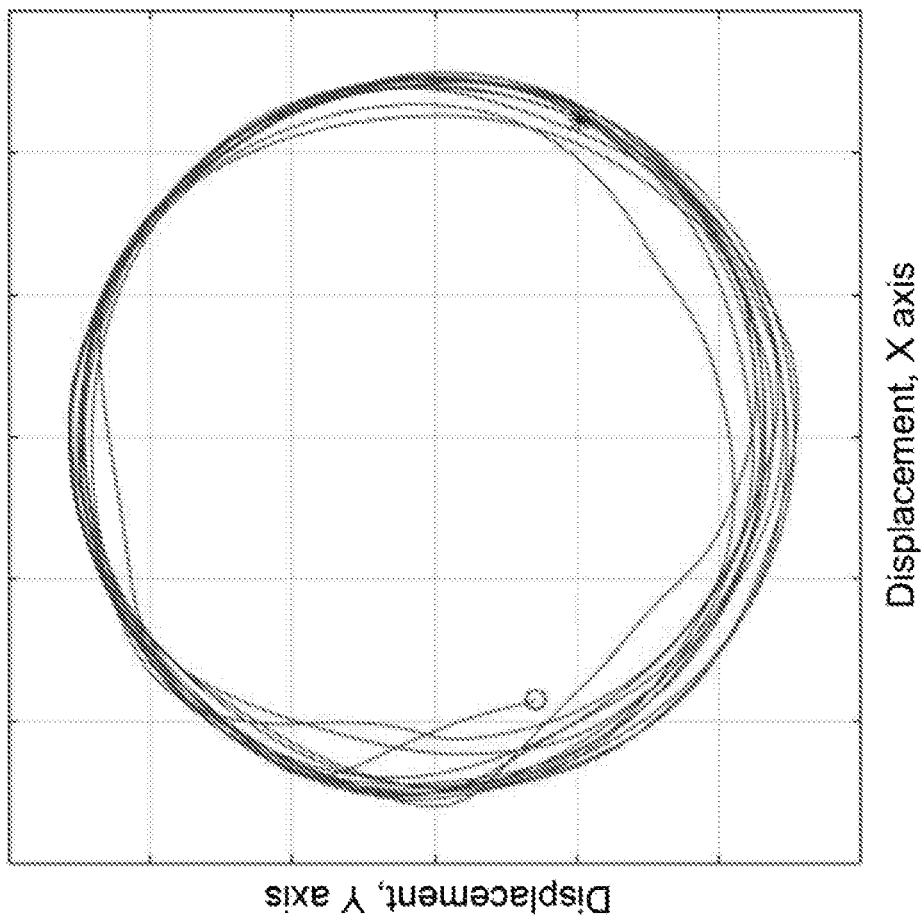
FIG. 3 depicts a NMR tool movement according to one or more embodiments disclosed herein.

The movement of the LWD tool 120 may be random motion with a small amplitude, a smooth forward whirl motion with a medium amplitude, a rough backward whirl motion with an even larger amplitude (which is a situation that may occur when a large WOB is applied in drilling vertically), or other types of motion. FIG. 3 is a plot of the displacement of an LWD tool 120 within a borehole showing displacement perpendicular to the longitudinal axis of the borehole.

As described above, NMR measurement may be made by applying two magnetic fields, namely static magnetic field ($B_0$) and oscillating magnetic field ($B_1$), to the nuclear spins in the specimen. The distributions of these magnetic fields may be determined by tool geometry. If there is net relative displacement between the tool and the specimen in inhomogeneous magnetic fields, nuclear spins in the specimen experience time-varying magnetic fields. Such variation of magnetic fields can cause signal attenuation, sometimes referred to as motion-induced decay (MID) which may be classified into two categories: (1) displacement-dependent signal loss and (2) velocity-dependent signal loss.

Displacement-dependent signal loss is due to the reduced sample volume observed by the tool during NMR measurement. If we consider a constant $B^0$ gradient g and constant $B_1$ over the sample volume, excitation slice thickness may be given by:

$$\Delta r = \frac{2B_1}{g}. \quad (1)$$

In the majority of LWD NMR measurements, both $B_0$ and $B_1$ are axisymmetric. Therefore, the resulting sample volume is quasi-cylindrical shell(s), and $\Delta r$ corresponds to shell thickness. For other NMR tools, sample volume may take a form of slab, cylinder, or more complex shape and, if the displacement is larger than the fraction of $\Delta r$, there will be signal loss according to the overlap between excitation and detection volume. The displacement being larger than the fraction of $\Delta r$, and the associated signal loss increase with long observation times, for example with $T_2$ measurements.

Figure 2:
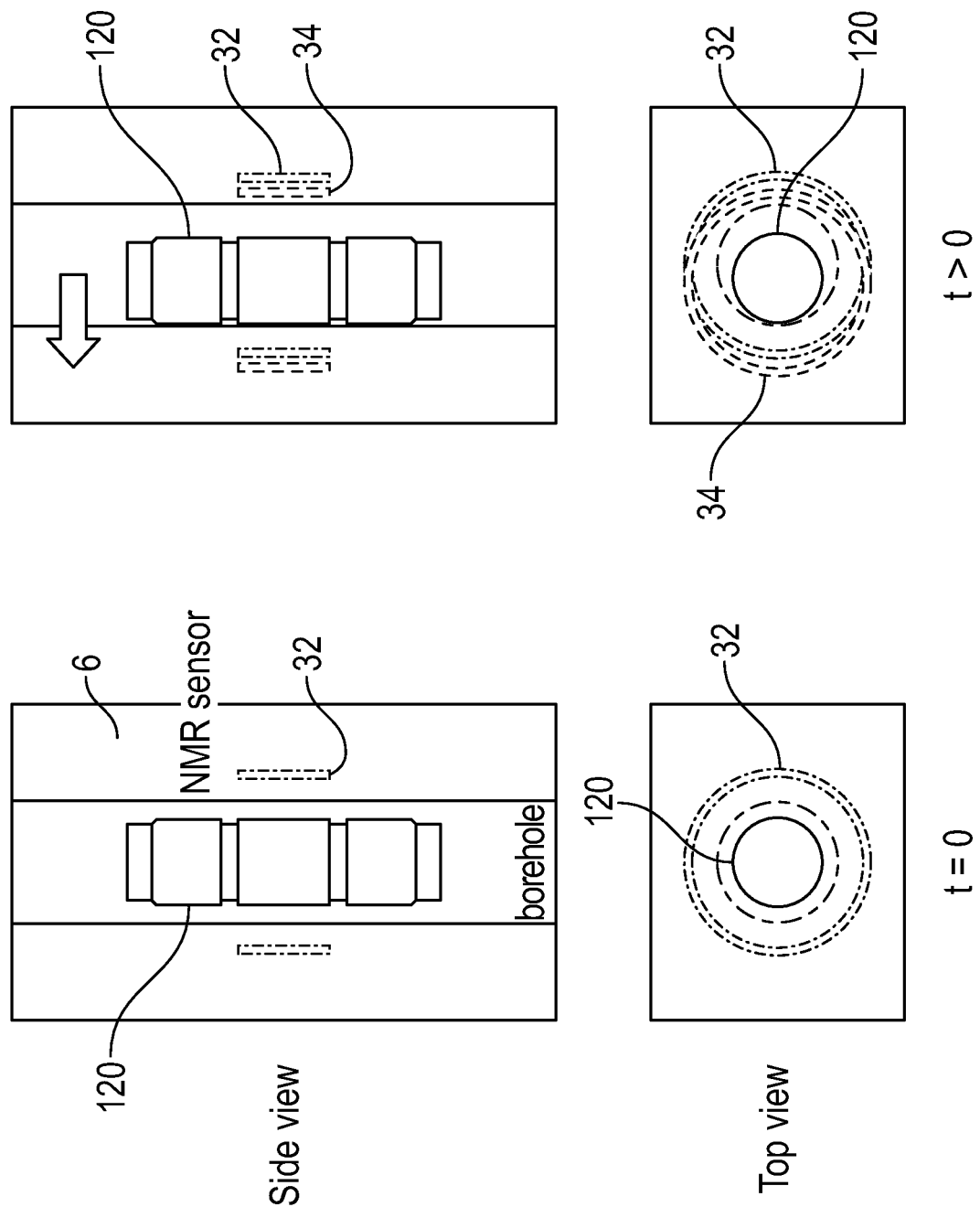
FIG. 2 depicts an NMR tool movement according to one or more embodiments disclosed herein.

As an example, FIG. 2 shows a portion of the BHA 100 including the LWD tool 120 NMR tool within a borehole 11 with lateral movement shown by the arrow 30. As shown in FIG. 2, the lateral movement changes a region excited for measurement 32. The left side of FIG. 2 shows the LWD tool 120 located at the center of the borehole and the region excited for measurement 32, but if during a time period that is on the order of a targeted time (e.g., a millisecond to several seconds), the LWD tool 120 moves laterally in the borehole 11 to the position shown on the right side of FIG. 2, and it can be seen that the detection region 34, the received slice, of the tool 120 does not overlap fully with the excited region 32. The effect of the LWD tool 120 motion may appear as additional signal decay that makes apparent $T_2$ value appear shorter than the intrinsic $T_2$ value, resulting in an underestimation of formation permeability.

Velocity-dependent NMR signal loss may due to the phase shift acquired by spins moving in a magnetic field gradient. This phase shift corresponds to the rotation of the effective rotation axis around the z-axis. It is analogous to applying pulses with particular phases, which would deviate from the optimal phase for the particular pulse sequence under use.

For example, CPMG pulse sequence yields a series of spin echoes by inverting the phase of the spins with refocusing pulses, so that they repeatedly pass through the points of the maximum coherence. Behavior of observed NMR signal depends on the phase of the excitation and refocusing pulses. Consider a spin that is moving at a constant velocity v in a static magnetic field with a linear gradient g. If we assume perfect pulses, extra phase shift acquired at the time of the first echo $t=t_E$ is:

$$\phi = \frac{\gamma g v t_E^2}{4}. \quad (2)$$

If we assume that the magnetization after the initial $90°_x$ pulse lies on the y-axis, then a $180°_y$ pulse acts like a pulse around an axis that is shifted from the y-axis by $\varphi/2$. Magnetization parallel to the effective rotation axis behaves as in the CPMG sequence and preserves the amplitude from echo to echo, while the component perpendicular to the effective rotation axis behaves as in the (unmodified) Carr-Purcell sequence and leads to the odd-even echo oscillations with the overall signal decay, especially when there are any pulse imperfections.

Such behavior may be applicable to systems where there is net relative displacement of spins with respect to the $B_0$ field, for example, when the tool is stationary and spins are moving, or vice versa. The signal loss may be caused by the variation of offset frequency $\Delta\omega_0=\omega_0-\omega_{rf}$, where $\omega_0(r)=\gamma B_0$ (r) is the Larmor frequency that is determined by local $B_0$ field at point r and the gyromagnetic ratio $\gamma$ of the nucleus (e.g. $\gamma=2\pi\times42.6$ MHz T$^{-1}$ for proton ($^1$H) observed in water and hydrocarbon), and $\omega_{rf}$ is the tool's operating frequency at which signal transmission/reception takes place. Therefore, it is possible to observe the same phenomena by creating a situation where each spin experiences the variation of $\Delta\omega_0$.

From Eqs. 1 and 2, the amount of signal loss under the presence of net relative displacement between tool and sample is determined by motion properties, such as velocity and amplitude and a few tool parameters (i.e., g, $B_1$, $t_E$) when other factors, such as pulse shape (hence excitation slice profile) and receiver bandwidth, are fixed.

Figure 4:
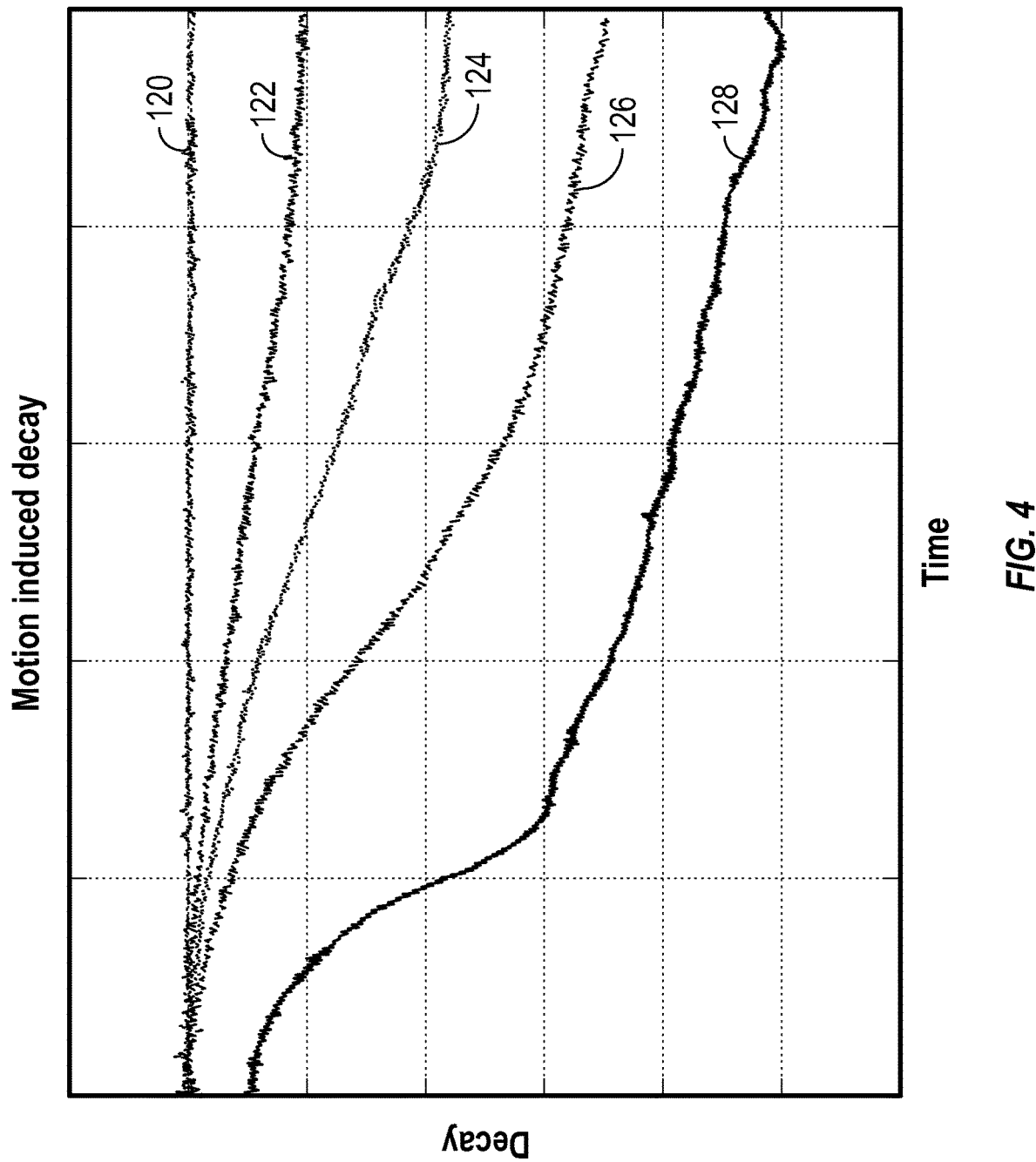
FIG. 4 depicts NMR signal decay due to motion according to one or more embodiments disclosed herein.

The behavior of the NMR signal under motion may be obtained by simulating spin dynamics in varying magnetic fields. FIG. 4 shows an example of motion-induced signal decay as a function of the radius of circular motion (increasing radii from line 120 to 128), which determines the displacement and velocity of motion with given frequency. FIG. 4 shows that the motion with a large amplitude induces a large signal loss at the end of a long CPMG measurement. In addition, motion with large velocity induces initial signal drop as suggested by Eq. 2.

Figure 5:
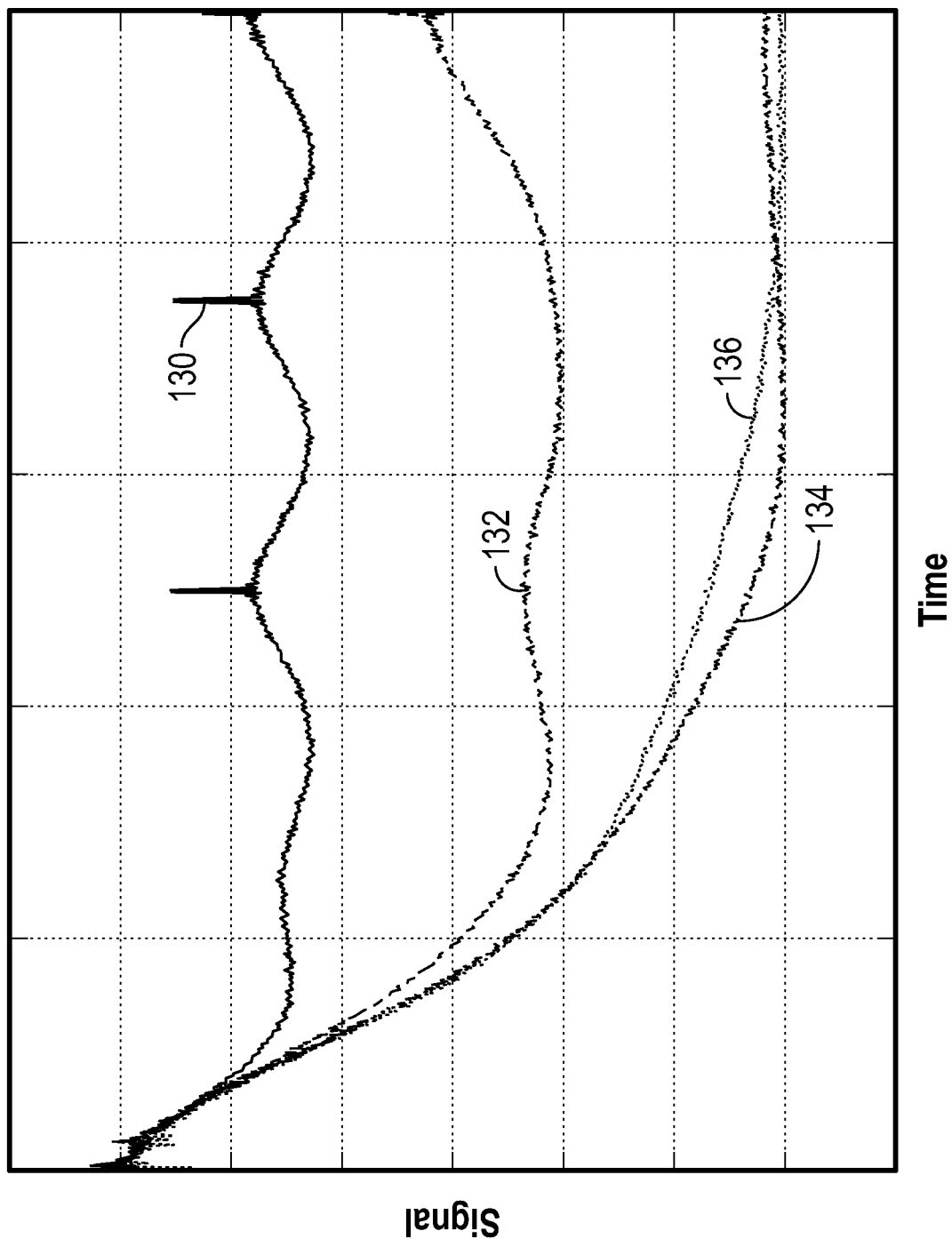
FIG. 5 depicts NMR signal over time according to one or more embodiments disclosed herein.

FIG. 5 shows another example of motion effect, where constant velocity v=2πrf was realized with different combinations of radius and frequency (increasing values of radii and frequency combinations from line 130 to 136). It can be seen that the initial signal decay is similar among different combinations, confirming that it is dictated by velocity. On the other hand, the amount of signal decay and periodic pattern are dependent on the radius and frequency of motion.

Figure 6:
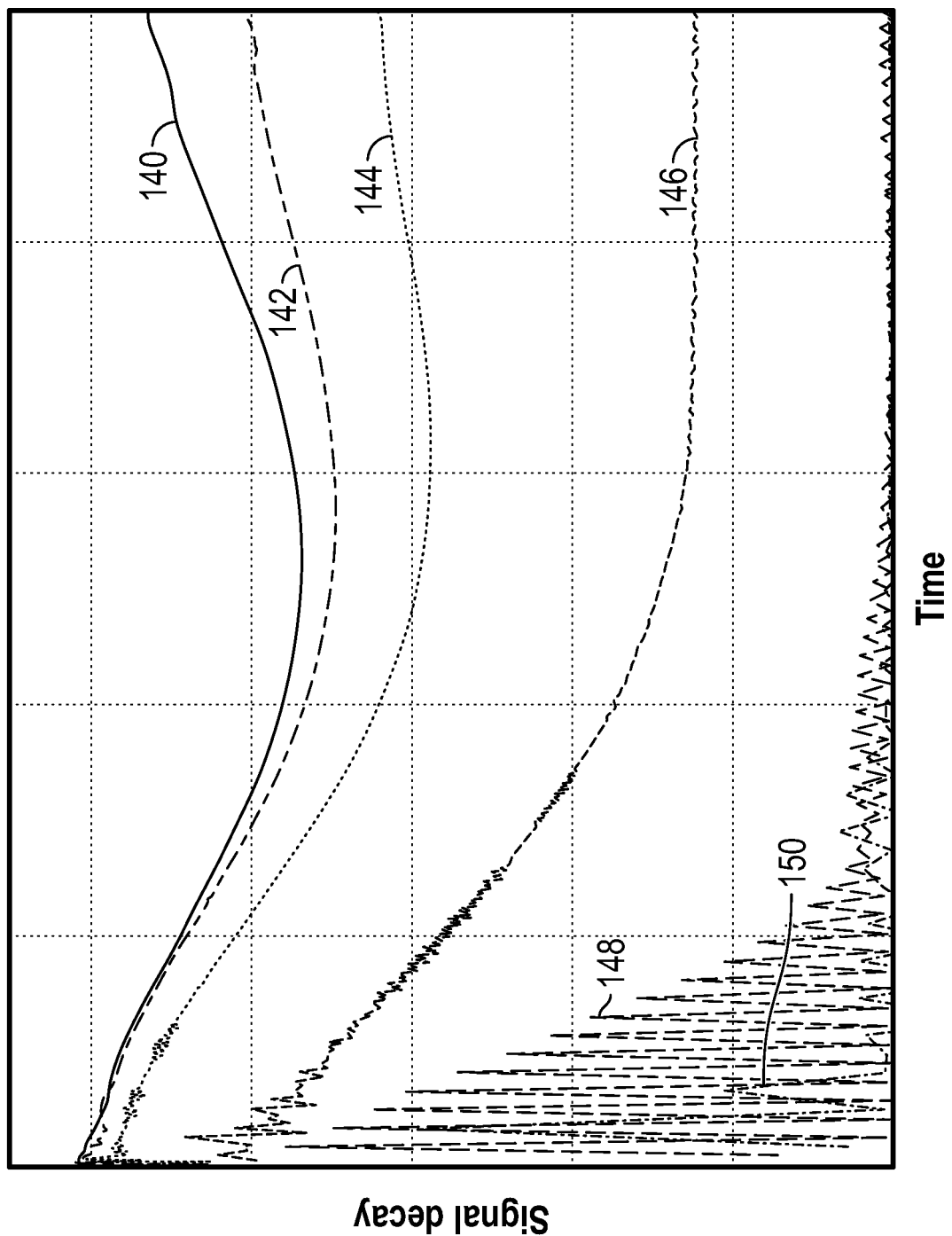
FIG. 6 depicts NMR signal decay over time according to one or more embodiments disclosed herein.

FIG. 6 shows another example of motion effect, where echo spacing $t_E$ was changed (increased from line 140 to 150) while other tool parameters and motion properties were fixed. It can be seen that short $t_E$ leads to less signal decay followed by some recovery after one cycle, while long $t_E$ results in even-odd echo oscillations and fast signal decay with no recovery.

As demonstrated in FIGS. 4-6, it is possible to simulate the behavior of the NMR signal under motion with full knowledge of a tool's motion properties. Precomputation of the NMR signal behavior and resulting measurement quality based on the velocity and amplitude of a tool's motion, without running a full NMR simulation in real time or in the downhole tool, may aid in determining the signal quality of the NMR signal by, for example, measuring a tool's motion during the tool's operation and the looking up the precomputed, estimated NMR signal quality based on the measured tool motion.

Figure 7:
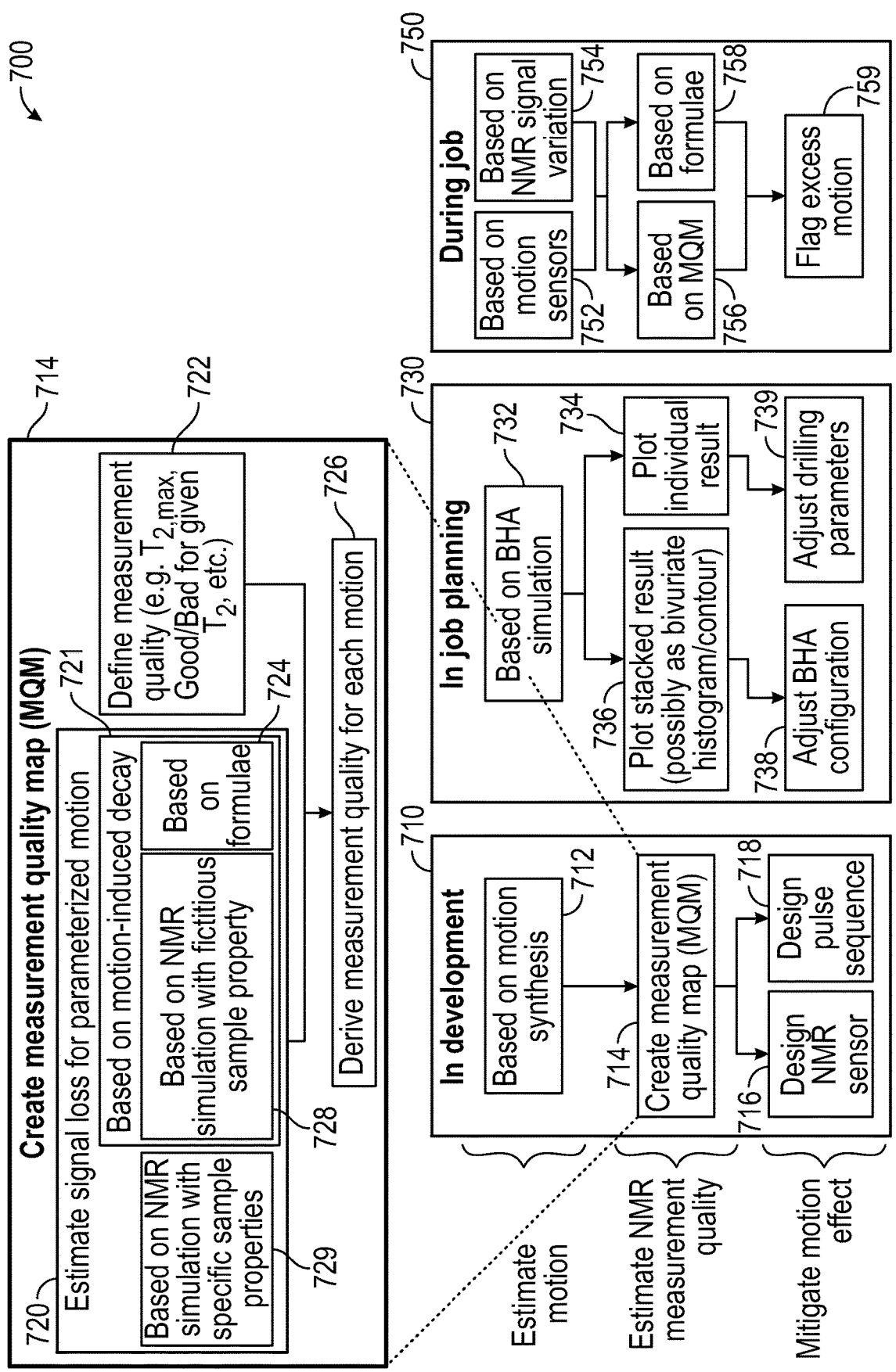
FIG. 7 method of estimating the quality of NMR measurement according to one or more embodiments disclosed herein.

FIG. 7 shows a schematic diagram of a method of estimating the quality of NMR measurement 700. This method is based on motion-induced signal loss being determined based on two motion parameters, velocity and displacement, a few tool parameters, for example, g, $B_1$, $t_E$, and other factors such as the formation type, for example, carbonate or shale, the well direction, for example, vertical or horizontal, friction factors within the borehole, and BHA configuration, for example, stabilizers near or far from the drill bit.

For a given tool and pulse sequence, NMR measurement quality can be obtained with motion properties as the reference indexes and may replace full NMR simulation in job planning and real-time drilling parameter optimization. This can also be used to estimate the benefit of increasing $B_1$ and/or reducing g and $t_E$ to improve motion sensitivity, as well as to implement self-diagnosis mechanism on a tool to detect, report, and possibly mitigate motion effect.

Those of ordinary skill in the art recognize that the other combinations of motion properties, such as acceleration and the history of tool position, may be used to derive the same information, since velocity is the integration of acceleration, and tool position is the integration of velocity. NMR measurement is affected by both velocity and displacement as described by Equations 1 and 2, therefore, in some embodiments, the instantaneous motion property (e.g. velocity at a single measurement timing) and also the time variation of such motion property (which leads to overall displacement) should be known.

As discussed above, $T_1$, $T_2$, and porosity are the major answer products provided by LWD NMR tools and other time-domain NMR spectrometers (or so called NMR relaxometer). Among them, $T_2$ and porosity measurements are known to be more sensitive to motion than $T_1$. For each answer, the permissible error level may be defined to aid in maintaining measurement integrity. Note that permissible error levels may be a function of $T_2$ and/or the porosity under consideration. For example, measurement of small porosity is associated with inherently large uncertainty regardless of the motion effect. In such a case, it would not make sense to define tight tolerance for motion-induced error. Therefore, permissible error level may be defined either as an absolute value (e.g., porosity unit (pu); in case of small porosity measurement) or a relative value (e.g., percentile; in case of large porosity and $T_1/T_2$ measurements).

The NMR measurement quality can be defined in multiple ways. In one embodiment, it may be defined as the maximum $T_2$ that can be measured with permissible error level. In another embodiment, it may be defined as the maximum porosity that can be measured with a permissible error level. In yet another embodiment, it may be defined as the classification of measurement, for example, Good, Acceptable, or Bad for given $T_2$ and/or porosity values. The choices of definitions will depend on the application. For example, if the sample property is unknown, for example in an exploration well, one may want to use the first definition so that the $T_2$ components below the maximum $T_2$ or another range of sample properties can be measured. On the other hand, if the target sample properties are known from adjacent wells and/or formation properties (e.g., shale), one may want to use the last definition to avoid putting unnecessary constraints on permissible motion.

An NMR measurement quality map may be generated as a function of motion velocity and amplitude and the quality definition. There are multiple ways to determine measurement quality including the use of spin dynamics simulations, motion-induced signal decay, and others.

In FIG. 7, a method to estimate the quality of NMR measurement 700 is depicted. The method may include one or more processes, such as estimating the quality of NMR measurements during tool development as depicted in block 710, estimating the quality of NMR measurements during job planning as depicted in block 730, and/or estimating the quality of NMR measurements during a borehole drilling job as depicted in block 750.

At block 710 a method for estimating the quality of NMR measurement during development is depicted.

At block 712 the motion of a tool may be estimated based on motion synthesis wherein tool motion is synthesized based on a variety of tool motion conditions such as in circular, semi-circular, and linear motion with a few parameters, such as motion amplitude and frequency, or through simulation, such as using models of various BHAs or tools. In some embodiments, a particular tool may operate at a few known nodes and the tool motion may be synthesized at each of these nodes.

At block 714 an NMR measurement quality map is created to estimate NMR measurement quality. In more detail, at block 720 an estimate for the signal loss for parameterized motion is generated. The estimate may be based on NMR simulation with specific sample properties as shown at block 729 and/or based on motion-induced decay at block 721. If the estimate uses motion-induced decay at block 721, then such decay may be based on NMR simulations with independent of formation 6 sample properties. In some embodiments, the estimate at block 721 may use motion-induced decay based on established formulas for estimating motion-induced decay, as shown at block 724.

At block 722 the desired measurement quality is determined. Such measurement quality may include qualitative determinations, such as good, acceptable, and poor, based on various ranges of potential NMR measurement quality. In some embodiments, the definition may also include quantitative determinations, such as maximum $T_2$ that can be measured with permissible error level ($T_{2,max}$) or $T_2$.

At block 726 the estimated signal loss of parameterized motion created at block 720 is combined with the defined measurement quality from block 722 to derive the measurement quality based on tool motion properties, such as amplitude of tool motion and the velocity of tool motion.

The estimation to tool motion from block 712 and the NMR measurements quality map from block 714 may be used to mitigate tool motion effects. For example, at block 716 the information from blocks 712 and 714 may be used to design the NMR sensor within the NMR tool, such as the tool 120, to mitigate the effect of expected tool motion at block 716 and/or to design NMR pulse sequences to mitigate the effect of expected tools at block 718. In some embodiments, at block 718, control signals for a pulse sequence are sent to a NMR measurement tool, such as tool 120. In some embodiments, parameters for the configuration of the tool 120 are output.

At block 730 a method for estimating the quality of NMR measurement during job planning is depicted. Estimates of the quality of NMR measurements may be used to aid in the configuration of the BHA and/or to adjust the drilling parameters that are to be used during the drilling operation.

At block 732 an estimation of motion of the tool may be created based on simulation of the BHA in operation in a borehole. The simulation may include variations and permutations of BHA configuration, formation properties, and drilling parameters, such as weight-on-bit and RPM, borehole angle, and other parameters.

At block 734 and/or block 736 an estimate of the NMR measurement quality is determined. For example, at block 736, the estimation of motion of the NMR tool created at block 732 may be stacked to generate an estimation of motion for a given NMR tool under normal operating condition. In estimating the motion of the NMR tool each operating condition of a BHA, including velocity and amplitude, may be assigned with a weight and then those weights are used to determine an estimate of motion for a given BHA under normal operating condition. For example, if the BHA is expected to be operated under a first condition for 20% of the time, a second condition for 50%, and a third condition for 25%, then then BHA simulation results for the first, second, and third conditions are stacked with the weight of 0.25, 0.50, and 0.25, respectively and yield the stacked motion properties of the NMR tool. Then, by comparing the stacked results of various BHAs, an optimal BHA may be chosen at block 738 and the instructions for configuring and/or assembling the BHA may be output.

At block 734 the individual results for each of the first, second, third, or more operating conditions for a particular BHA configuration may be evaluated to determine which operating conditions for the particular BHA condition yield acceptable or unacceptable results. At block 739, the NMR measurement quality map for the particular BHA may be used to aid in determining drilling parameters for use in drilling a borehole. In some embodiments, at block 739, control signals for adjusting the drilling parameters of a well site system, such as well site system 5 may be output. In some embodiments, a control system, such as control system 140, receives drilling parameters and adjusts the drilling of the borehole 11.

At block 750 a method for estimating the quality of NMR measurement during a job, such as drilling operations, is depicted. Estimating the quality of NMR measurements during drilling operations may be used to flag NMR measurement data that is recorded during excess tool motion and/or may also be used to adjust drilling parameters such as weight-on-bit and rotational speed in real time, during drilling.

At block 752 an estimation of tool motion may be created based on information gathered from sensors on the BHA. In some embodiments, at block 754, an estimation of tool motion may be created based on NMR signal variation recorded during drilling.

At block 756, an estimate of NMR measurement quality may be determined using an estimation of motion crated at block 752 or block 754 and an NMR measurement quality map, such as the NMR measurement quality map generated at block 714. The estimation of NMR measurement quality may be used at block 759 to flag NMR measurement data that is recorded during excess tool motion and/or may also be used to adjust drilling parameters such as weight-on-bit and rotational speed in real time, during drilling.

At block 758, an estimate of NMR measurement quality may be determined using an estimation of motion created at block 752 or block 754, for example, a formula or equation that is a curve fit of estimated signal decay based on motion as a function of displacement shown in FIGS. 12 and 13, as discussed below. For example, a Gaussian or other types of shape mathematically implementable equation, such as a third-order polynomial may be used to represent the motion induced decay as a function of x might be represented as shown in Eq. 2.1, where x is displacement and i corresponds to velocity category given in the legend of FIGS. 12 and/or 13. This, when compared to measurement quality map generated at block 756, can reduce the amount of memory used to store information related to the estimate of NMR measurement decay because just a few sets of coefficients for categorized velocity, rather than hundreds of combinations of velocity and displacement and resulting NMR quality as used at block 756. In some embodiments, a formula may be obtained by fitting an NMR measurement quality map with polynomial. In this way, estimated motion may be correlated with a variety of measurement quality definition, for example as defined at block 722. The estimation of NMR measurement quality may be used at block 759 to flag NMR measurement data that is recorded during excess tool motion and/or may also be used to adjust drilling parameters such as weight-on-bit and rotational speed in real time, during drilling. In some embodiments, a control system, such as control system 140 may indicate, for example, to an operator, that the BHA is exhibiting excess motion.

$$MID(x)=a_i*x^3+b_i*x^2+c_i*x+d_i \quad (2.1)$$

Figure 8:
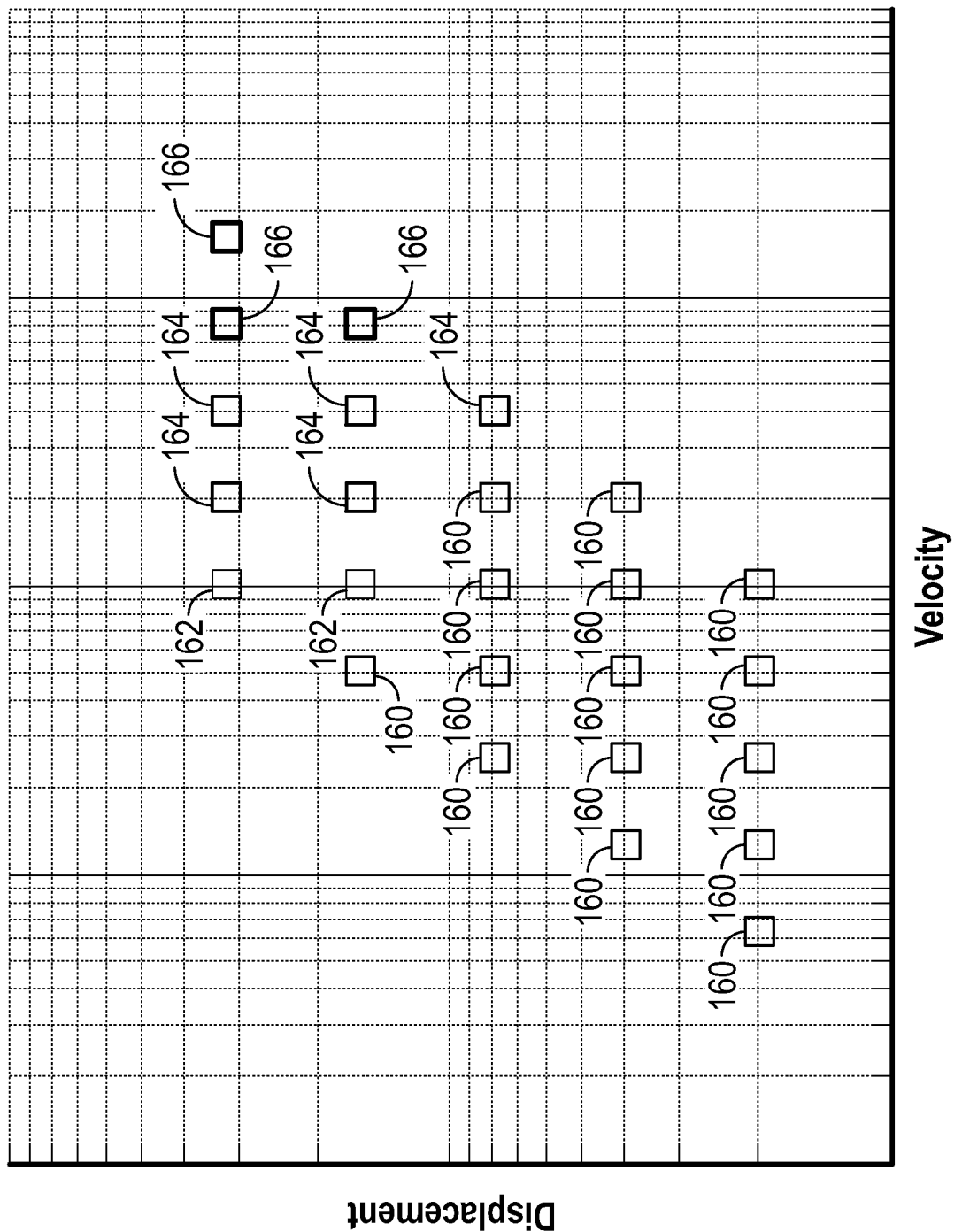
FIG. 8 an NMR measurement quality map according to one or more embodiments disclosed herein.

In one embodiment, an NMR measurement quality map may be generated by analyzing NMR signal behavior under synthesized motion. Such procedures may be implemented, for example, at block 712 or block 714. FIG. 8 shows an example of a NMR measurement quality map. NMR signal behavior for use in generating an NMR measurement quality map may be obtained by simulating the evolution of spin ensembles in time-varying magnetic fields. By moving the magnetic fields with respect to spin ensembles, motion effect can be reproduced as was seen in FIGS. 4-6. The amount of field variation at given time steps may be obtained by motion synthesis, for example, at block 712 and/or motion simulation, for example, at block 732.

Figure 9:
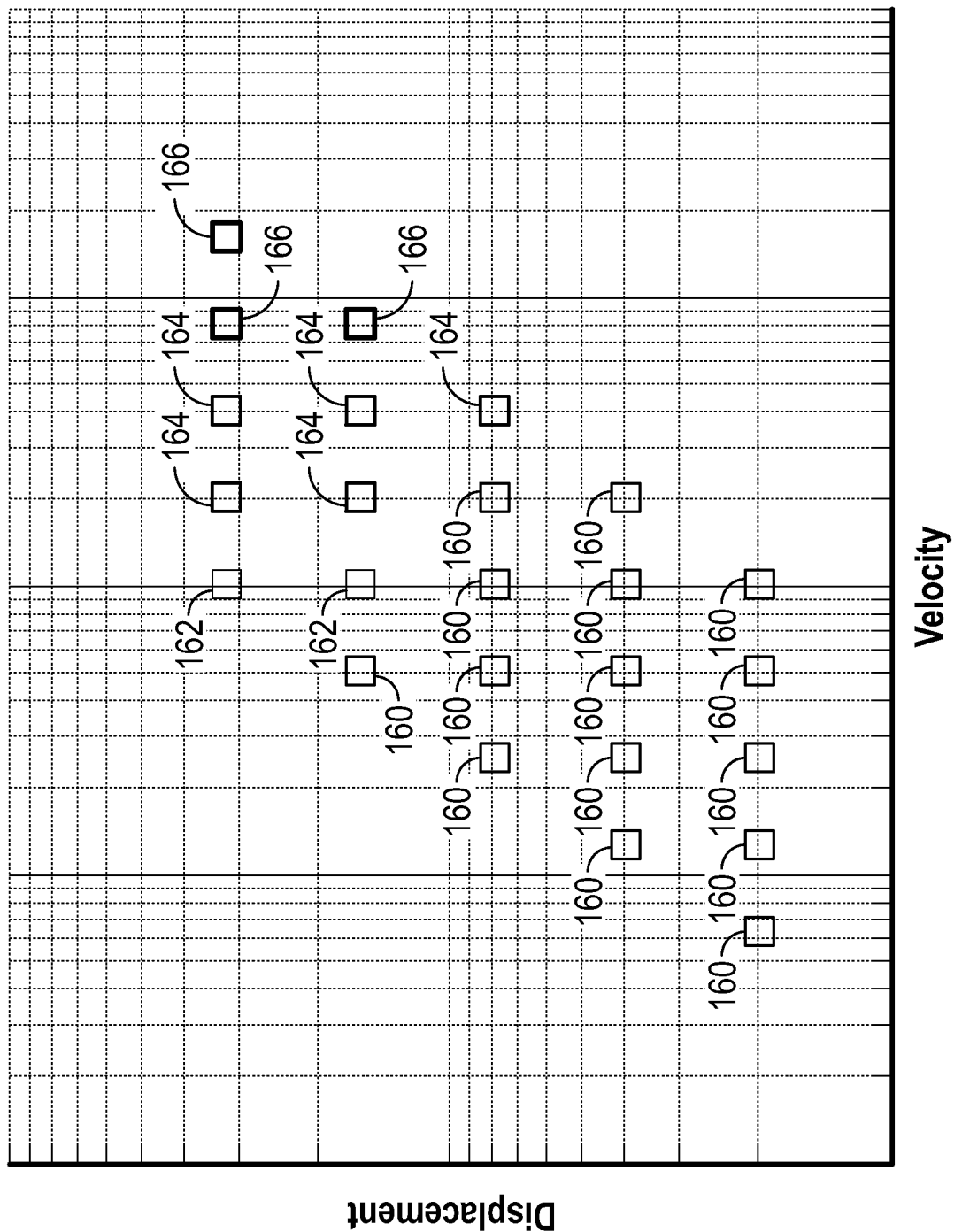
FIG. 9 an NMR measurement quality map according to one or more embodiments disclosed herein.
Figure 10:
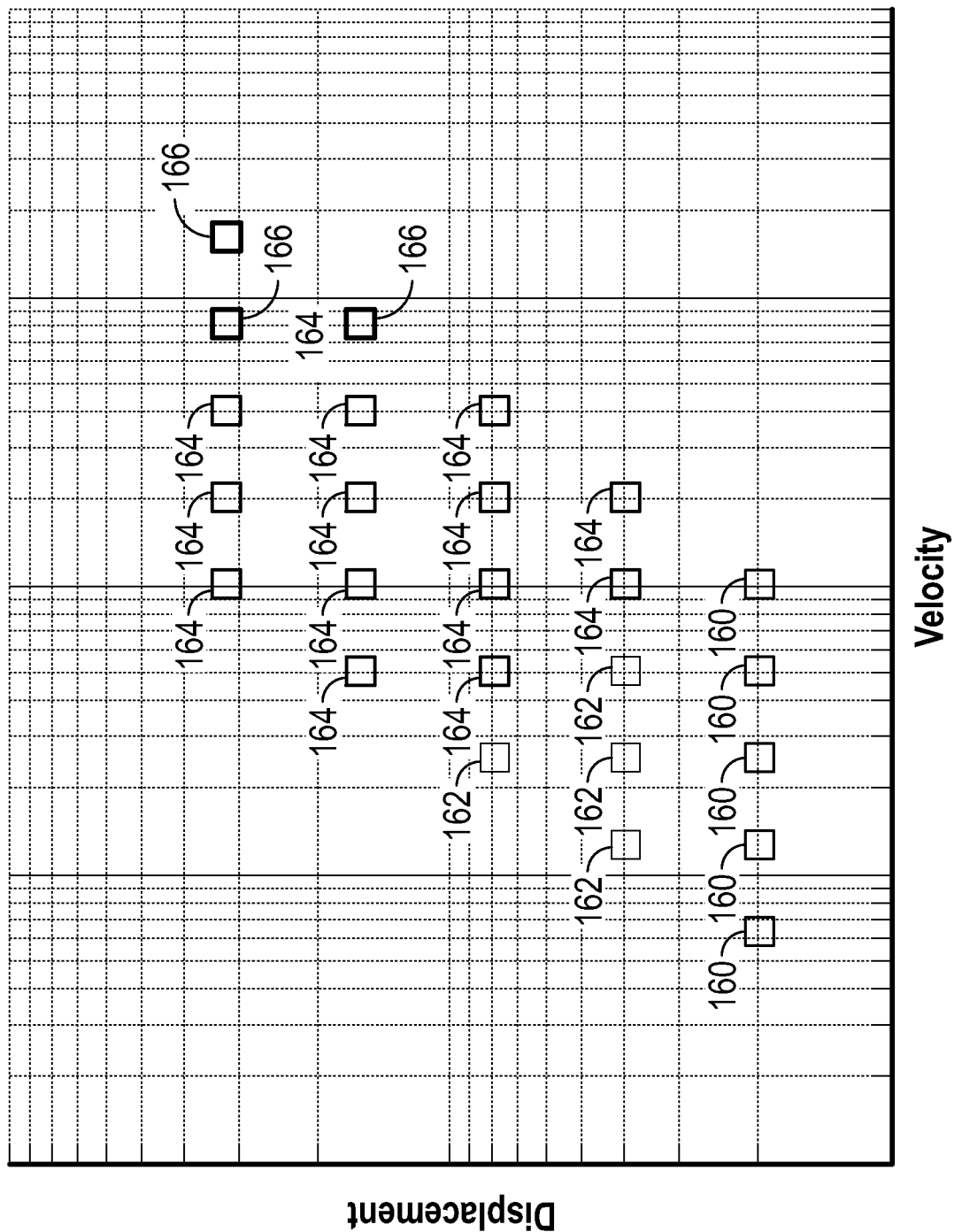
FIG. 10 an NMR measurement quality map according to one or more embodiments disclosed herein.

A range of motion data may be generated using such motion syntheses or simulation. Interpolation methods may also be used to interpolate between the results of two motion conditions to generate additional data and improve the estimate quality of the NMR measurement quality map. FIG. 8 shows an example of such maps with $T_{2,max}$ (i.e., the maximum sample $T_2$ that can be measured without compromising data quality in any of three measurements: Porosity, $T_1$, and $T_2$) as the quality indicator. This method may use multiple NMR motion simulations to increase the resolution in $T_{2,max}$. In the NMR measurement quality maps shown herein, the colors of the squares represent the maximum sample's $T_2$ that can be measured without compromising data quality. For example, the green squares 160 indicate a $T_{2,max}$ (which represents a sample's maximum $T_2$ that can measured without compromising data quality) of 3 seconds, yellow squares 162 indicate a $T_{2,max}$ of 100 ms, red squares 164 indicate a $T_{2,max}$ of 5 ms, and black squares 166 indicate that the motion-induced error in the measured sample which has a $T_{2,\,sample}$ of less than 5 ms may still exceed the permissible error level. A tool's sensitivity to motion varies from one tool to another and therefore the NMR measurement quality maps also vary from tool to tool. FIGS. 8-10 show examples of NMR measurement quality maps for two different tools. The maps show estimated NMR measurement quality based on $T_{2,max}$. The NMR tool used to generate the NMR measurement quality in FIG. 9 has smaller g, larger $B_1$, and shorter $t_E$ than the tool used to generate the NMR measurement quality in FIG. 10, thus the tool used to generate the NMR measurement quality of FIG. 9 has generally better measurement quality under a given set of motion parameters because it has a lower sensitivity to motion.

An NMR measurement quality map may also be generated by plotting NMR measurement quality as a function of effective displacement and velocity. The effective displacement is given in the unit of excitation slice thickness:

$$d_0 = \frac{2B_1}{g}. \quad (3)$$

The effective velocity is given in the unit of velocity limit to avoid excess phase shift introduced by motion:

$$v_0 = \frac{2\pi}{\gamma g t_E^2}. \quad (4)$$

Figure 11:
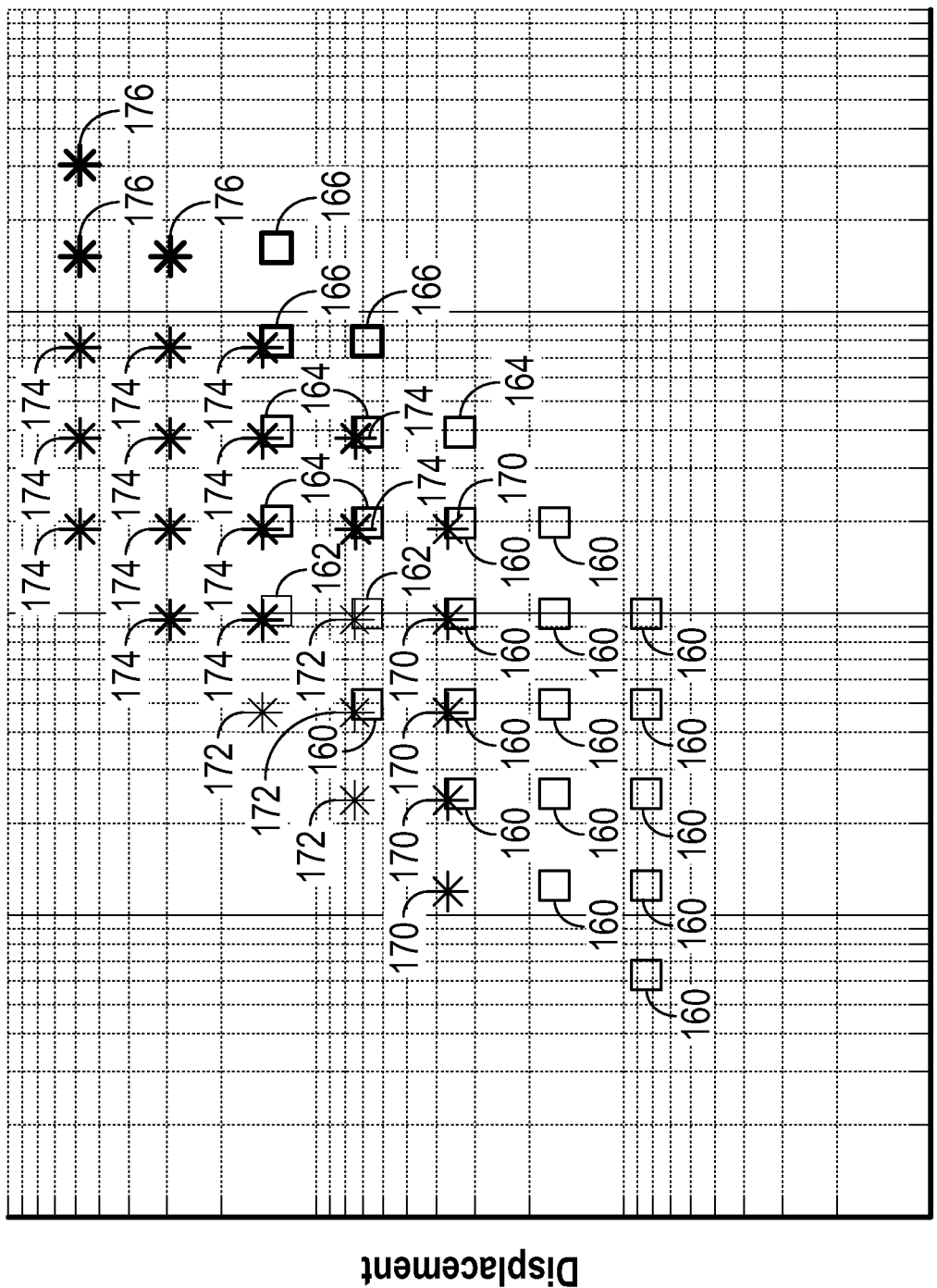
FIG. 11 an NMR measurement quality map according to one or more embodiments disclosed herein.

FIG. 11 is a consolidated measurement quality map obtained by converting the axes of FIGS. 9 and 10 to effective displacement and velocity. Square markers 160-166 represent the tool in FIG. 9, while asterisks 170-176 represent the one in FIG. 10. When plotted in this way, the two tools exhibit similar motion response that is characterized by velocity and displacement. This shows that motion sensitivity is largely dependent on three tool parameters, g, $B_1$, and $t_E$, in the above equations. In other words, motion tolerance can be improved by reducing g and $t_E$ and/or increasing $B_1$. Such improvement in motion tolerance would be reflected in the NMR measurement quality maps of FIGS. 8-10 as an expanded green region 170 that extends further in the upper-right direction of the chart.

In some embodiments, a NMR measurement quality map may be a lookup table with the velocity and the displacement parameters of tool motion as reference indexes and estimated NMR measurement quality as the result.

In some embodiments, continuous $T_{2,max}$ may be derived from signal decay induced by motion. Such motion-induced decay (MID) may be calculated by assuming semi-infinite $T_2$ in the spin dynamics simulation. If there is no motion, such system will return a signal with effectively no decay over the period of measurement. Then any signal decay observed under the presence of motion may be attributed to the motion. FIGS. 4-6 are examples of such simulations. The signal decay attributed to tool motion may be used to generate the lookup tables discussed above.

In a special case, MID may be derived from net relative displacement. According to Eq. 2, to avoid appreciable phase shifts in NMR signal, $$\frac{\gamma g v t_E^2}{4} << \frac{\pi}{2}. \quad (5)$$

Thus, if tool motion, v, is much smaller than the velocity defined by:

$$v_{ph} = \frac{2\pi}{\gamma g t_E^2} \quad (6)$$

then the phase shift introduce by motion is minimal and in some embodiments may be neglected.

When above condition is satisfied the motion of the tool is sufficiently slow compared to $t_E$ and the on-resonance spins adiabatically track the effective rotation axis to gradually get off-resonance. This process may be determined by the amplitude of motion and may be irrespective of the speed of motion.

Figure 12:
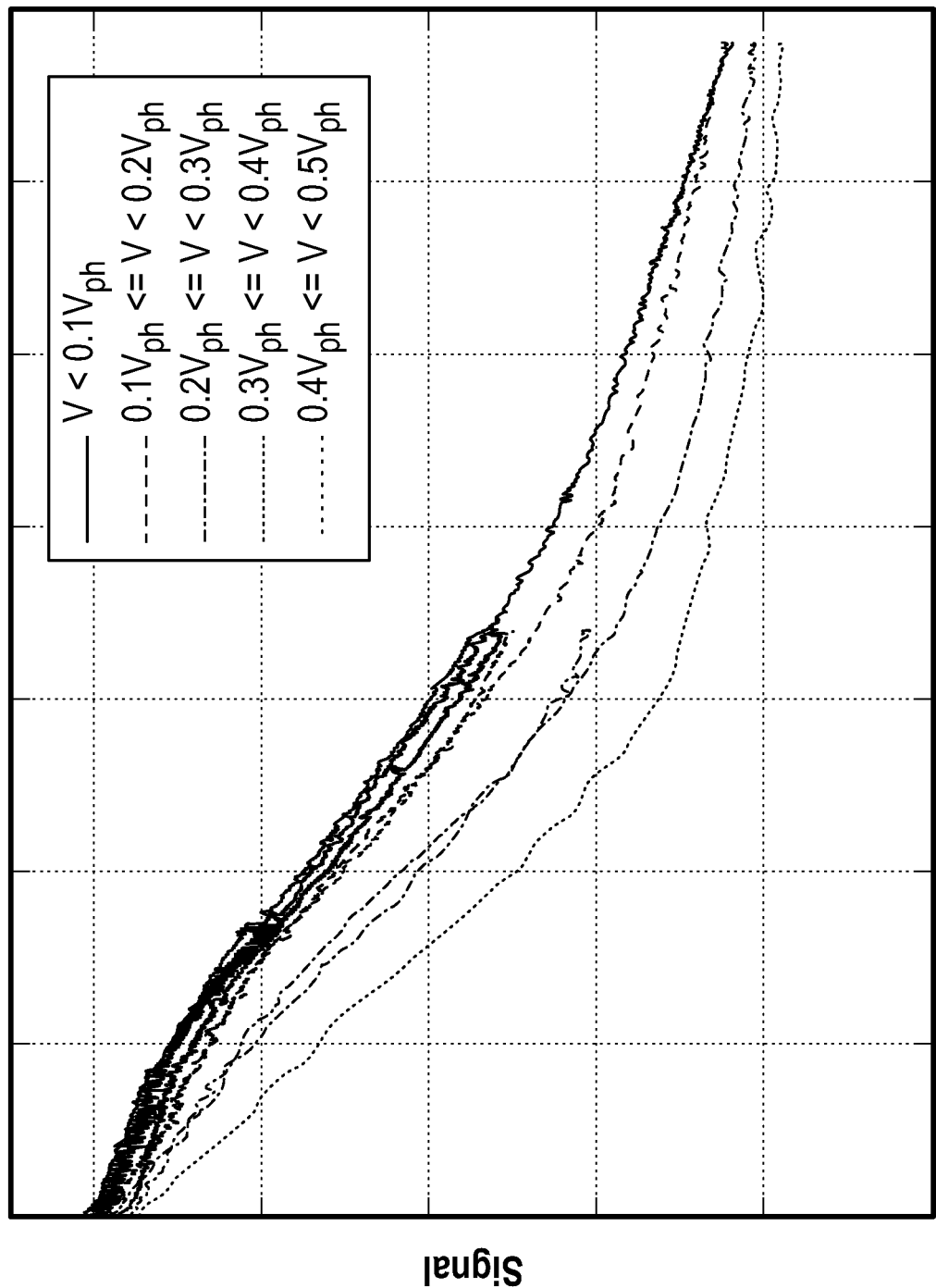
FIG. 12 depicts NMR signals according to one or more embodiments disclosed herein.
Figure 13:
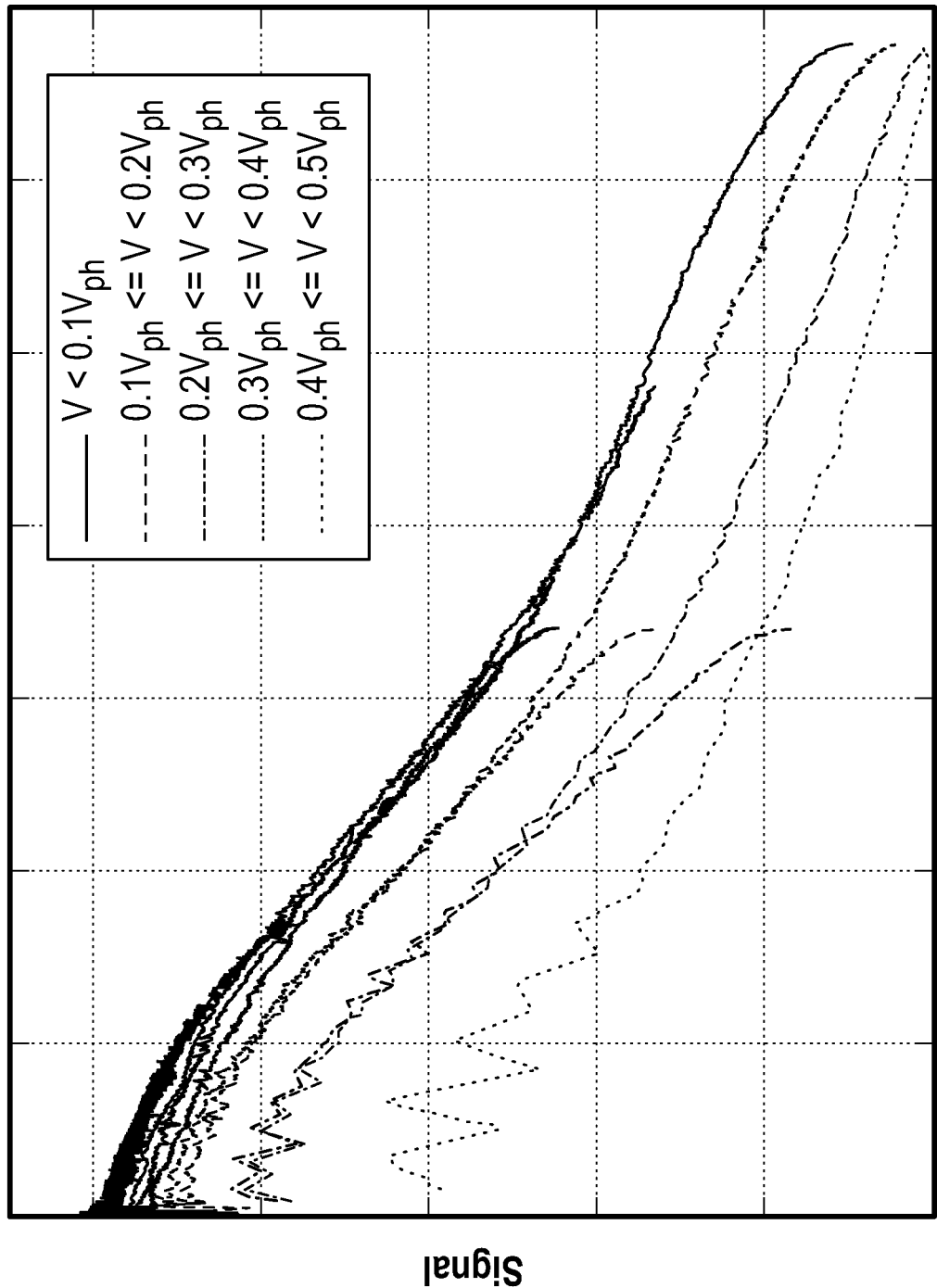
FIG. 13 depicts NMR signals according to one or more embodiments disclosed herein.

FIG. 12 shows an example of signal decays for linear motion as a function of displacement and FIG. 13 shows an example of signal decays for a circular motion as a function of displacement. Each line in the graphs shown in FIGS. 12 and 13 represent the result for one combination of velocity and amplitude of motion. When the velocity is much smaller than $v_{ph}$ defined by Eq. 6, the curves fall onto each other regardless of the realization of the combination of amplitude and frequency. When velocity is sufficiently small, less than 0.1 $v_{ph}$, linear and circular motion exhibit equivalent signal decay up to ~Δr and suggests that estimating MID under such conditions can be undertaken without knowing or simulating the trajectory of the motion of the tool to a very precise level. When motion velocity is increased, it exhibits initial signal drop due to phase incoherence.

Thus, the amount of signal decay based on the displacement and velocity can be estimated without knowing the trajectories of the tools to a very precise degree. Therefore, even when motion simulation and measurements provide information that is not timely correlated with NMR measurement, NMR signal loss can still be estimated when overall, time averaged, or other similar motion properties are provided. Therefore, low resolution tool motion measurement data, for example at a rate of 1 Hertz, may be used to estimate NMR measurement quality.

Once MID is obtained, the time constant $T_{2,mid}$ may be derived for the decay. Then apparent decay time constant $T_{2,app}$ of observed NMR signal may be given by:

$$\frac{1}{T_{2,app}} = \frac{1}{T_{2,int}} + \frac{1}{T_{2,mid}}. \tag{7}$$

Figure 14:
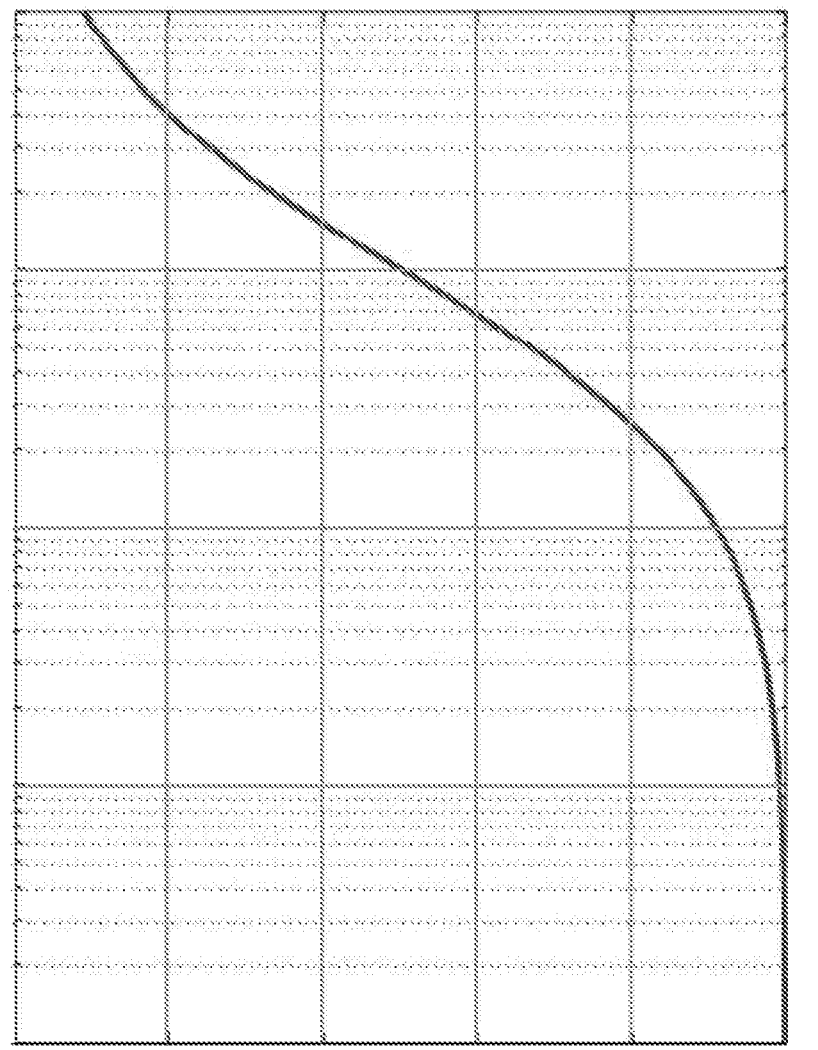
FIG. 14 depicts an apparent decay time constant of an observed NMR signal verses an intrinsic decay time constant associated with a sample property according to one or more embodiments disclosed herein.

Here, $T_{2,int}$ is the intrinsic decay time constant associated with a sample property. FIG. 14 shows an example of $T_{2,app}$ for given $T_{2,mid}$.

Once $T_{2,app}$ is calculated from Eq. 5, $T_{2,max}$ may be obtained by comparing motion-induced error and permissible error, the latter of which is derived from intrinsic uncertainty in the measurement of given $T_{2,int}$. The error introduced by motion may be defined as:

$$T_{2,error} = \exp\left(\left|\log\left(\frac{T_{2,int}}{T_{2,app}}\right)\right|\right) - 1. \tag{8}$$

Figure 15:
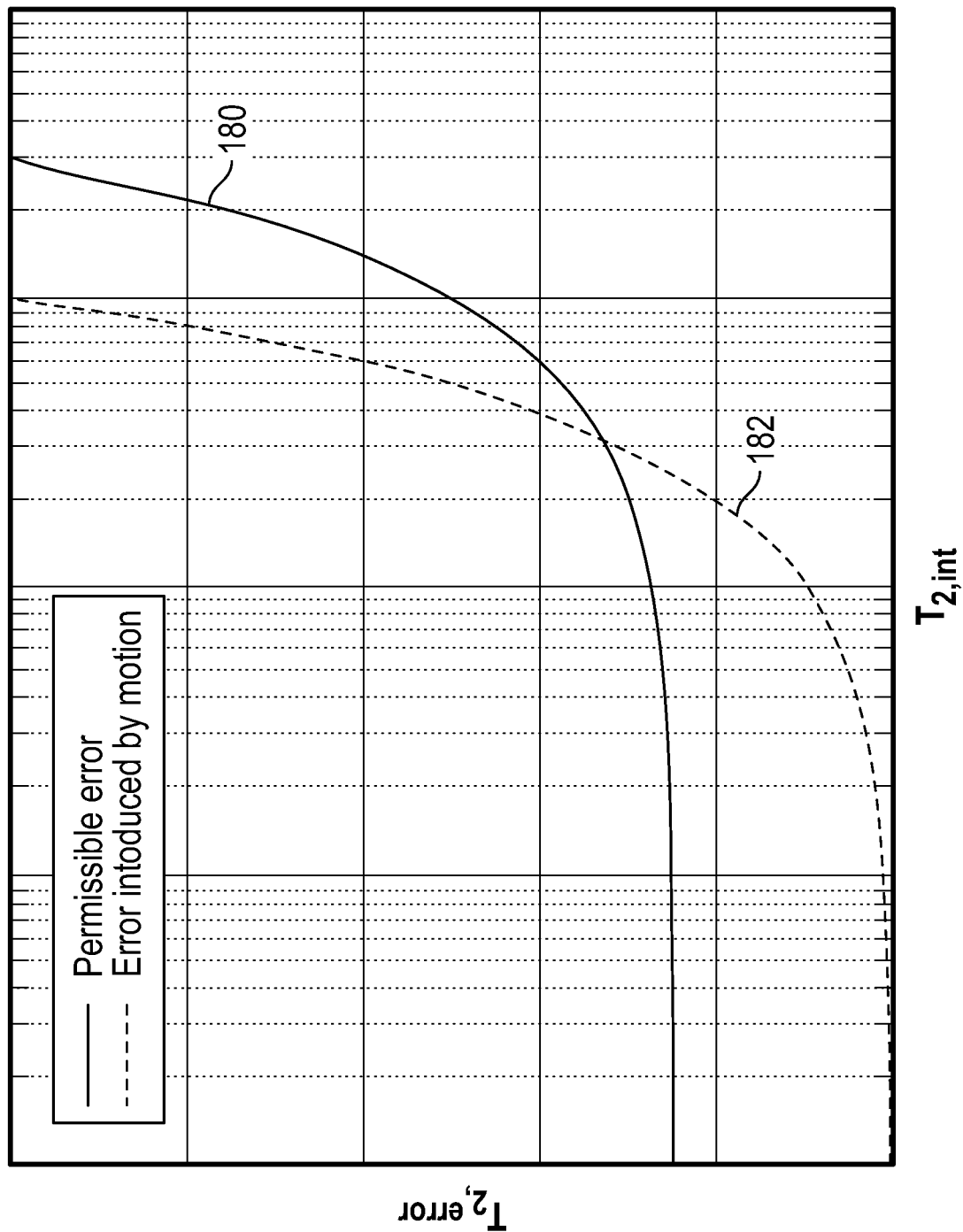
FIG. 15 depicts permissible error and estimated error introduced by motion according to one or more embodiments disclosed herein.

FIG. 15 shows the permissible error 180 and $T_{2,error}$ 182 defined above. The intersection of two lines is the $T_{2,max}$ that represents the longest $T_2$ measured without having motion-induced error as the dominant uncertainty. Unlike simulating the evolution of spin ensembles in time-varying magnetic fields, discussed above with reference to FIGS. 8-11, where the resolution of $T_{2,max}$ is determined by the number of $T_2$ values used in NMR simulation, simulating motion-induced decay provides a continuous $T_{2,max}$.

As discussed above, NMR measurement quality under motion may be estimated from two motion properties: velocity and amplitude. To use the NMR measurement quality maps to estimate NMR measurement quality, an estimation of tool motion may be measured or computed.

In one embodiment, tool motion may be simulated based on the parameters that affect motion properties in a BHA dynamics simulation. Such simulation may occur at block 732 of FIG. 7. For instance, in the case of an LWD NMR tool, the parameters for a BHA dynamics simulation may include, for example, the configurations of bottom hole assembly (BHA), formation properties (e.g., lithology), mud properties (e.g., density, viscosity), borehole properties (e.g., size, trajectory), and drilling parameters (e.g., WOB, RPM, mud flow rate). Other factors that may also affect tool motion may also be incorporated in motion estimation. When contributing factors to tool motion are well defined, the range of motion expected for a given system may be estimated.

Multiple methods may be used to estimate tool motion, including, for example, analytical modeling, frequency domain modeling, time domain modeling, and others. In some embodiments, tool motion may be measured by sensors such as accelerometers, magnetometers, gyroscopes, calipers, standoff measurement sensors, or a combination of sensors. Such measurement may occur, for example, at block 752 of FIG. 7. However, motion sensors are may be located away from the NMR sensor, providing data that does not reflect tool motion at the location of the NMR sensor. In such a case, motion measurement may be used to calibrate a motion simulation, or vice versa.

In some embodiments, for example wireline tools, rugosity or other borehole imperfections or other interactions between the tool string and the formation can generate motion perpendicular to the main direction of motion of the tool. Such movements may be simulated or measured and correlations between such movements and nuclear magnetic resonance measurement quality may be used to provide an indicator of nuclear magnetic resonance measurement quality or to mitigate tool motion effects on nuclear magnetic resonance measurement quality.

In another embodiment, tool motion may be estimated from the NMR signal itself. Such estimates may be based on the principle that motion affects overall echo amplitude, and also the shape and phase of each echo. These behaviors can be characterized for a given tool and environment, and results may be used to estimate motion properties from the echo shape. Such estimation of motion may occur, for example, at block 754 of FIG. 7.

Figure 16:
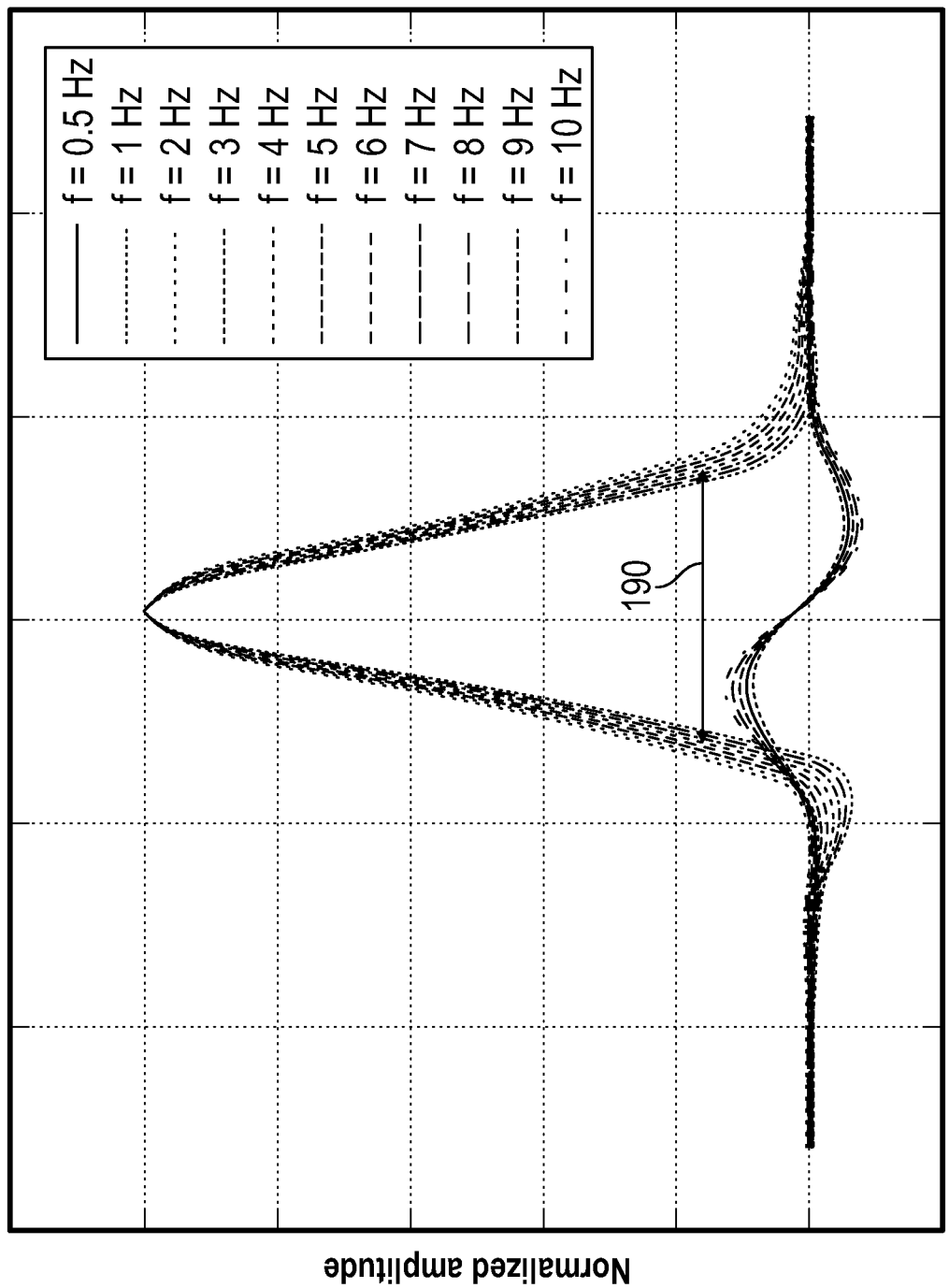
FIG. 16 depicts normalized NMR signal verses time for a variety of motion velocities according to one or more embodiments disclosed herein.
Figure 17:
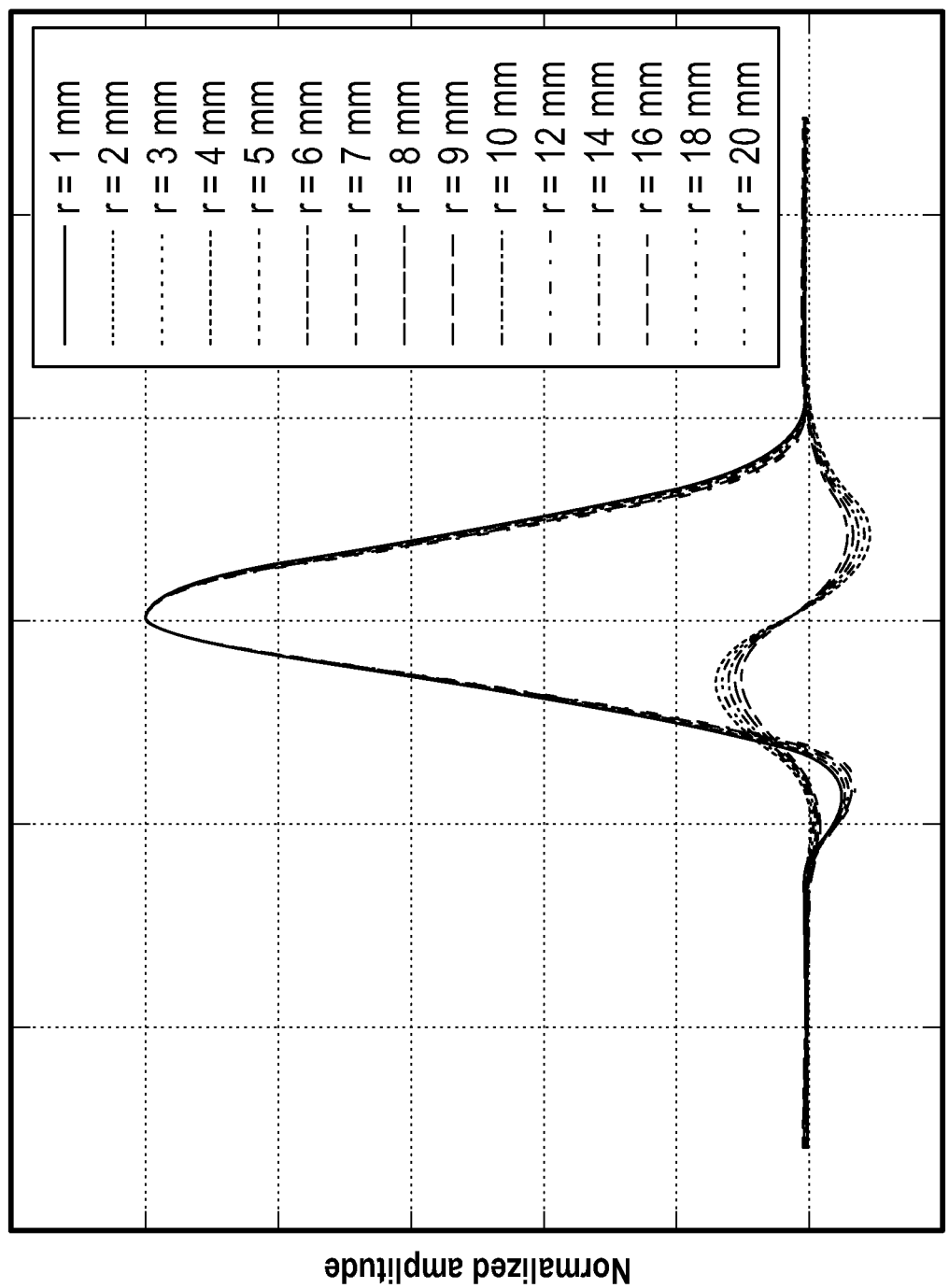
FIG. 17 depicts normalized NMR signal verses time for a variety of motion amplitudes according to one or more embodiments disclosed herein.

FIG. 16 shows an example of the variation of echo shape as a function of motion velocity realized with various frequencies of motion and fixed amplitude. It can be seen that the echo width 190 increases with motion frequency. While FIG. 17 shows the variation of echo shape as a function of motion amplitude. It can be seen that the amplitude of the imaginary part increases with motion amplitude.

In another embodiment, motion may be estimated from CPMG obtained with different $t_E$. As understood from Eq. 2, additional phase shift causes NMR signal loss under motion as a function of $t_E^2$. This dependence is shown in FIG. 6. Therefore, using multiple CPMG measurements with two or more $t_E$ values allows for the estimation of the amount of phase shift introduced by tool motion, from which tool motion velocity may be derived. In the same manner, comparison of signal amplitude at the middle/end of CPMG provides the amplitude of the tool motion. Such multi-$t_E$ sequence provides both the estimate of motion properties and the effect on NMR measurement.

The nominal motion properties obtained using either the BHA dynamics simulation method or NMR-based motion estimation method may be used in estimating the NMR measurement quality.

Motion properties obtained by simulation, measurement, and/or NMR-based estimation, may exhibit variations over time that lead to different NMR measurement qualities estimated from an NMR measurement quality map. In such a case, a likelihood of motion properties may be represented by a bivariate histogram and/or a contour map that covers the range of possible motion. Such maps may be generated at block 736 of FIG. 7.

Figure 18:
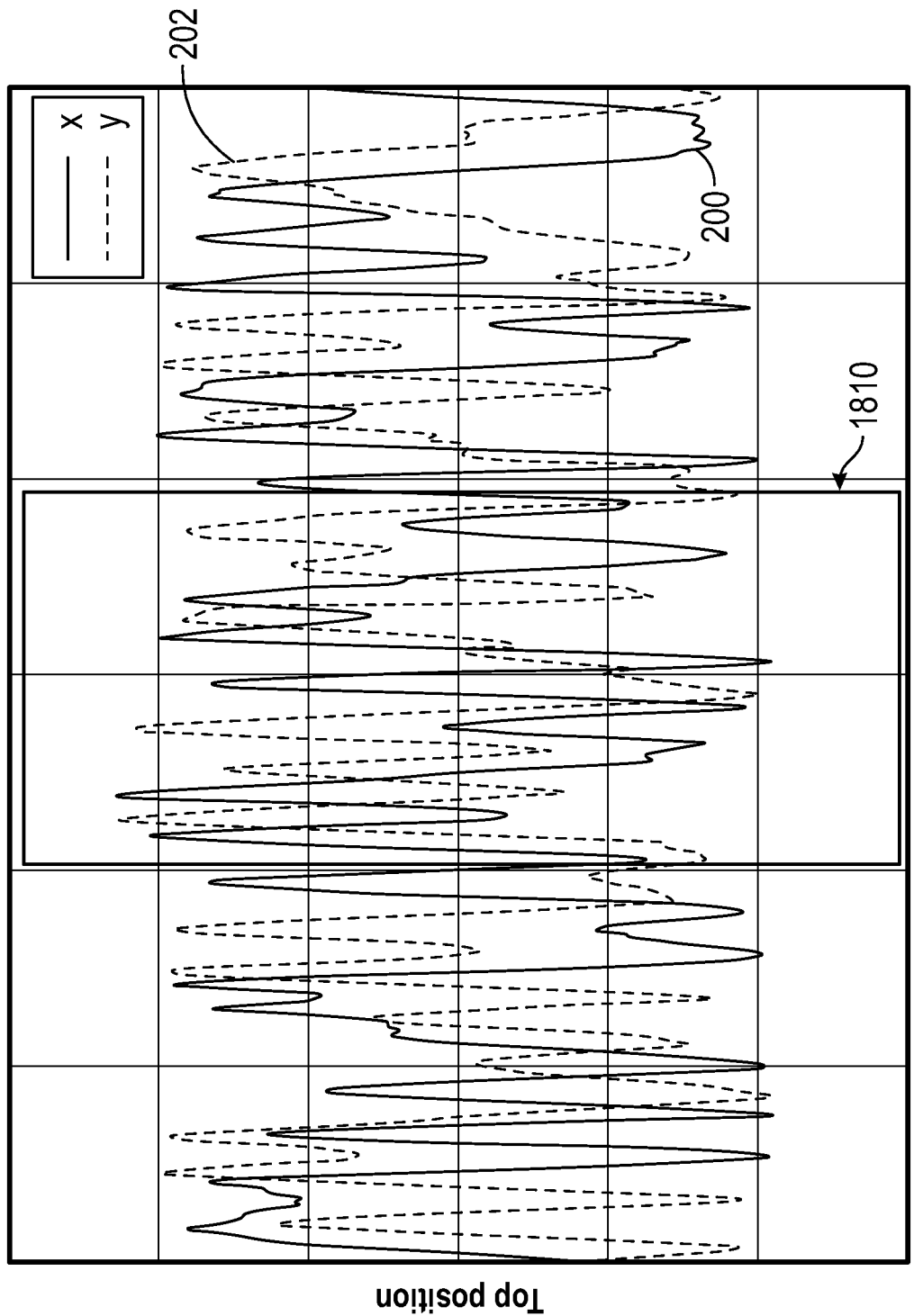
FIG. 18 depicts tool position verses time according to one or more embodiments disclosed herein.
Figure 19:
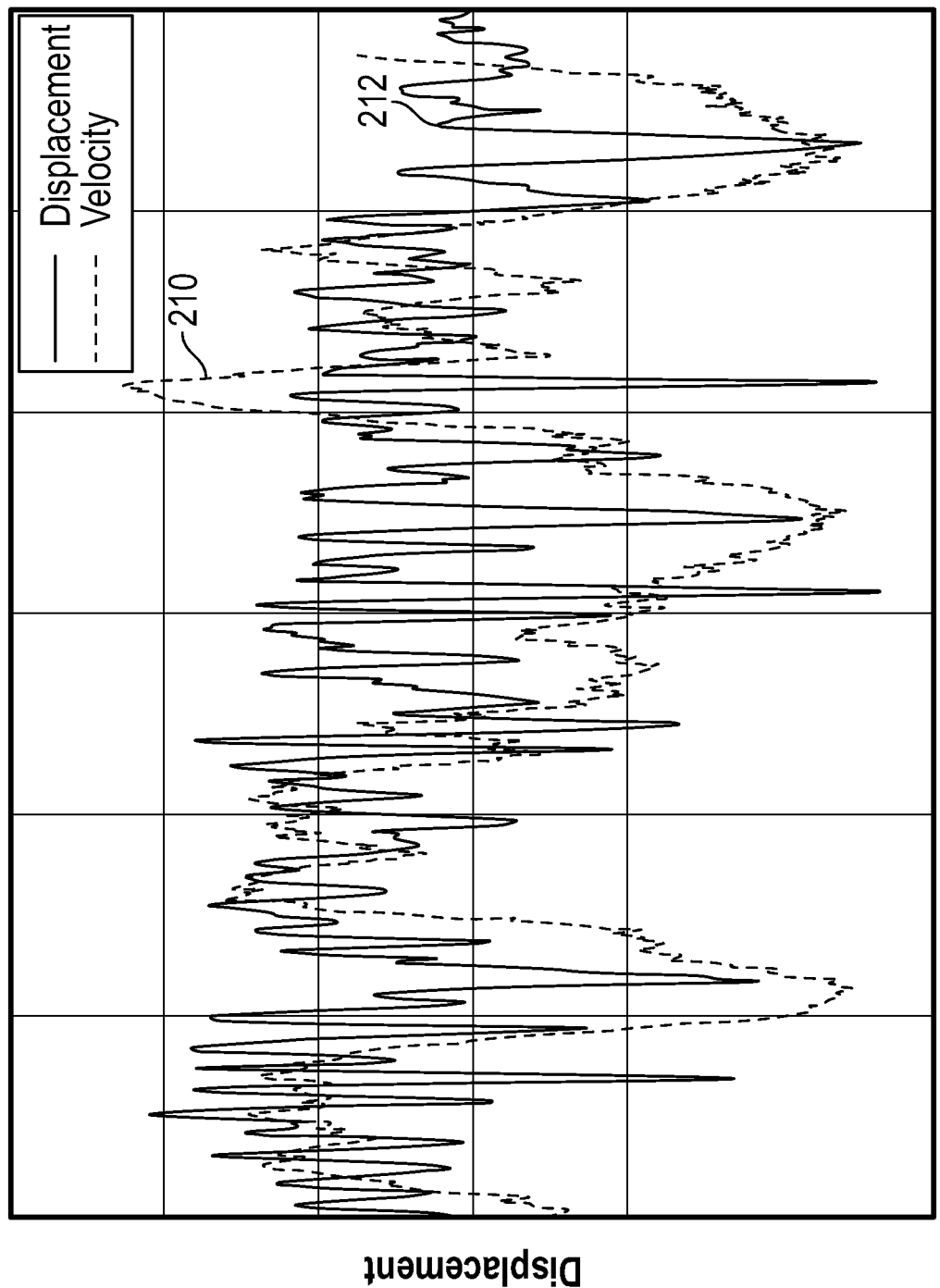
FIG. 19 depicts motion properties verses time according to one or more embodiments disclosed herein.
Figure 20:
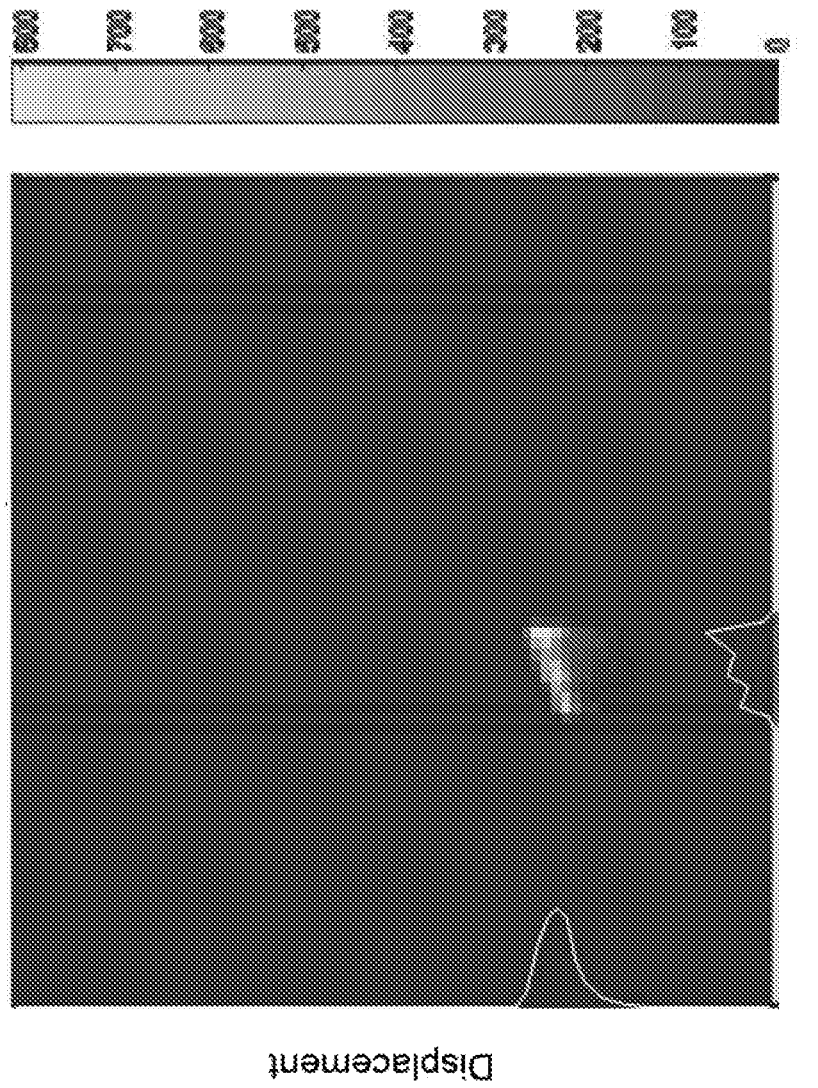
FIG. 20 tool motion displacement verses tool motion velocity according to one or more embodiments disclosed herein.
Figure 21:
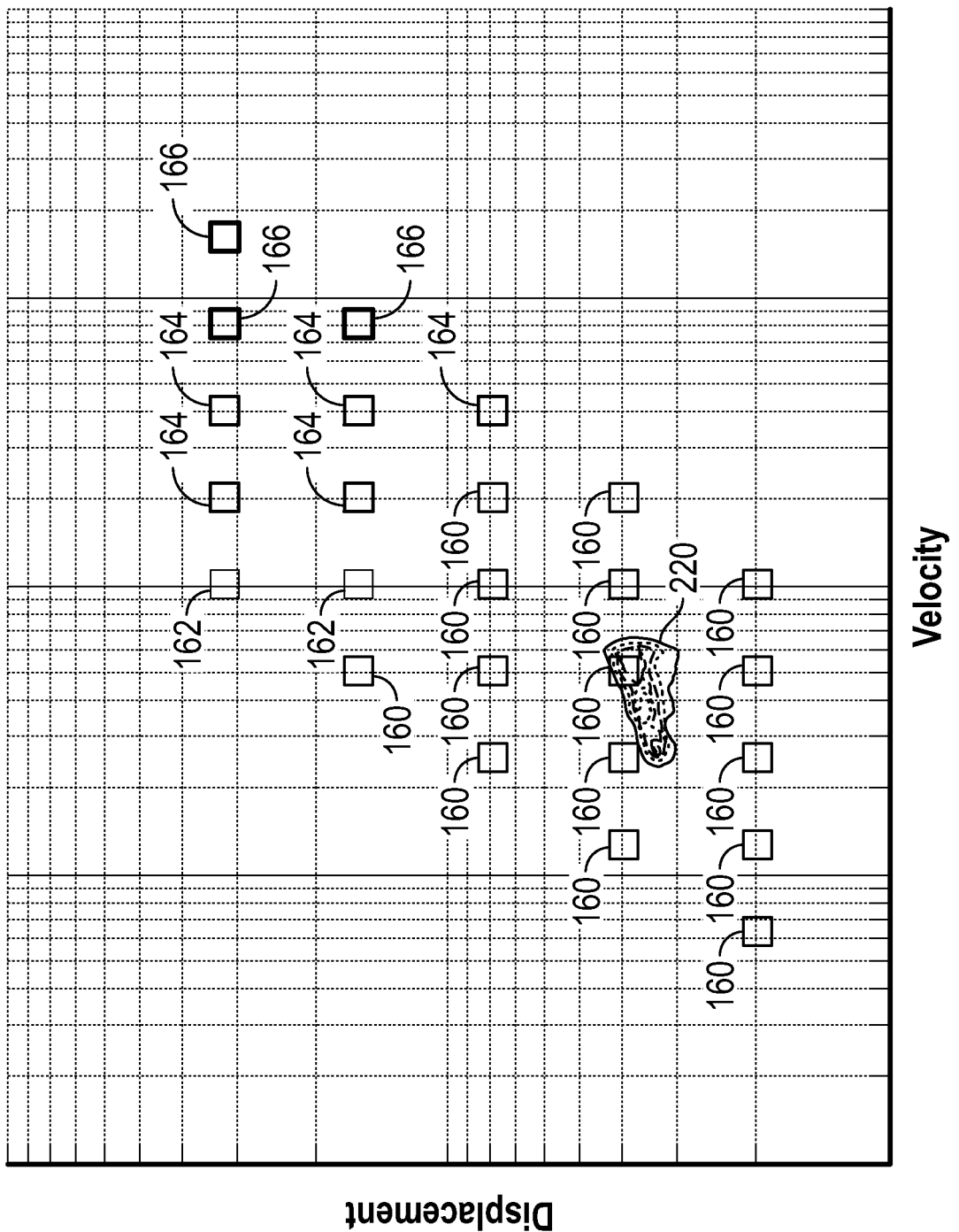
FIG. 21 an NMR measurement quality map overlaid with a tool motion contour map according to one or more embodiments disclosed herein.

FIG. 18 shows an example of tool trajectory represented by the time variation of x and y coordinates. That is, FIG. 18 shows an x-coordinate 200 of the tool trajectory and a y-coordinate 202 of the tool trajectory over time. The patterns are not uniform and show variations in amplitude and velocity of the tool motion. The tool motion properties that may be used to estimate NMR measurement quality include the maximum displacement and mean velocity of a one-second-long observation window 1810. Shifting the observation window 1810 along the time axis and recording the maximum displacement and mean velocity at each time step yields the variation of velocity 210 and displacement 212 over time, as shown in FIG. 19. These parameters may be used as the tool motion under a given set of conditions. The maximum displacement and mean velocity of a one-second-long observation window may be plotted as a bivariate histogram, for example, as shown in FIG. 20 or in a contour map 220, the latter of which may be overlaid onto the NMR measurement quality map as shown in FIG. 21.

Figure 22:
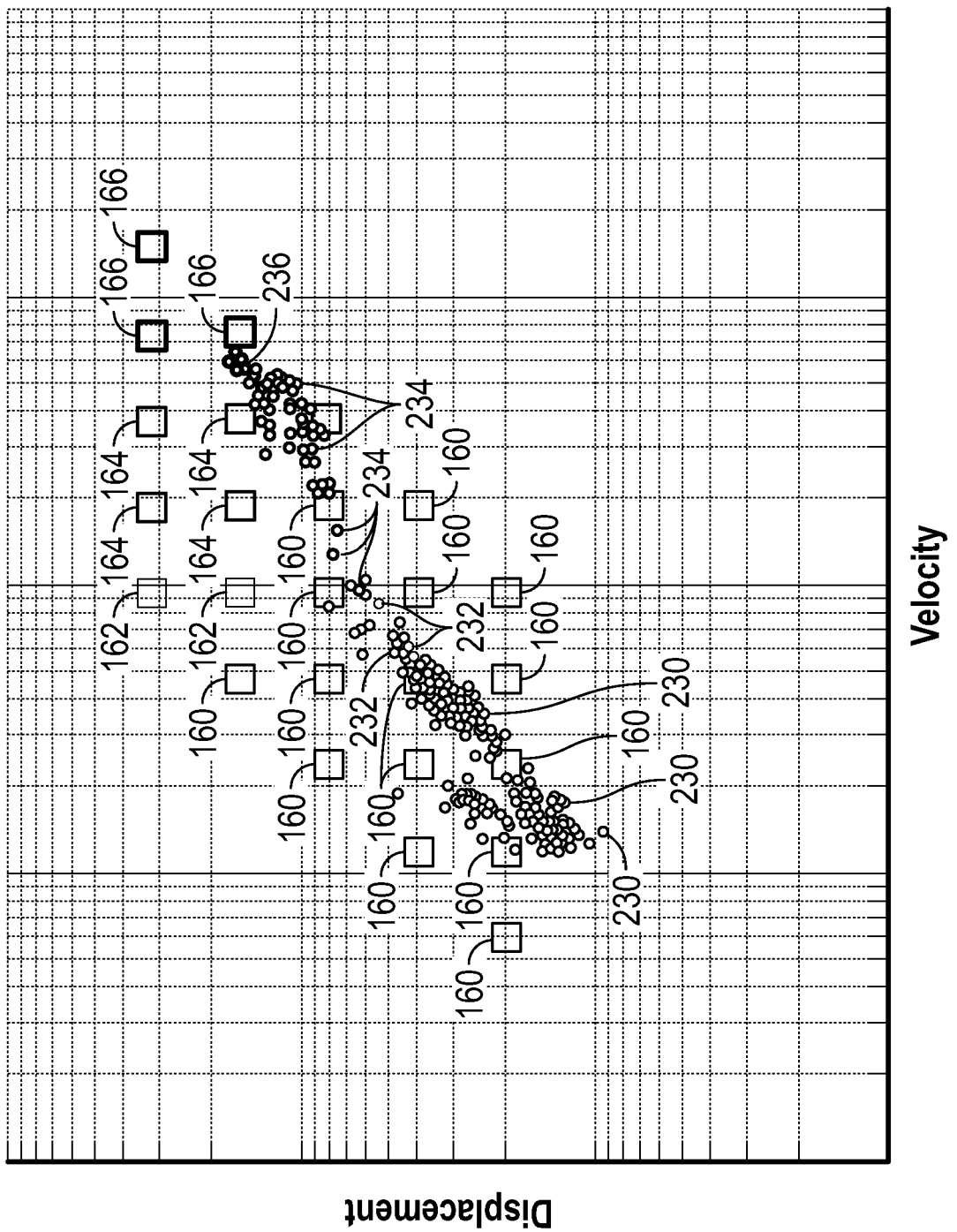
FIG. 22 an NMR measurement quality map overlaid with bottom hole assembly trajectory data according to one or more embodiments disclosed herein.

FIG. 22 shows an example NMR measurement quality map for an example LWD NMR tool. The squares 160-166 represent the measurement quality using synthesized circular tool motion of at various velocities and amplitudes. The dots 230-236 represent the nominal properties of simulated BHA trajectories obtained with different combinations of formation and drilling parameters. Color-coded NMR measurement quality is consistent between two datasets, even though the simulated trajectories are highly non-uniform. The data in FIG. 22 shows that the amount of signal loss is dependent on tool motion velocity and amplitude. Therefore, NMR measurement quality under motion may be estimated by plotting motion properties, corresponding to the dots onto the predefined NMR measurement quality map, the squares, without knowing the exact trajectory of the tool motion.

The combination of NMR measurement quality maps with tool motion properties provides for planning optimization and real time optimization and/or quality control. Such planning optimization and real time optimization and/or quality control may occur at blocks 738, 739, and 759. For example, the tool motion measured or simulated while drilling may be applied to an NMR measurement quality map to determine whether the NMR measurement data is likely to have a high quality or a low quality. Such information may be used to change the drilling conditions, for example, if the NMR measurement quality map and tool motion estimation indicates that the NMR measurement quality is in a bad or low quality condition, then the drilling operation may increase or decrease the weight-on-bit, or the rotational speed of the drill string to move the estimated NMR measurement quality to a good condition, according to the NMR measurement quality map.

In one embodiment, an NMR measurement quality maps may be used to define the specification of an NMR sensor to mitigate motion effect, such as at block 716 of FIG. 7. For example, a static field gradient ($g=dB_0/dr$) plays a role in NMR sensor design, because it is a factor in the motion sensitivity of the tool and also NMR sensitivity, for example, a large static field gradient results in thin slice thickness and therefore, a smaller signal. With $B_0$ variation sensitivity, when $B^0$ changes due to temperature and/or magnetic debris, a small static field gradient results in a large shift because $dr=dB_0/g$. This is trade-off relationship and finding an operating point for a tool may include an analysis of each property as a function of g. Under such circumstances, a maximum g that provides acceptable NMR measurement under expected range of motion may be determined by generating an NMR measurement quality map and simulating or estimating tool motion.

In another embodiment generating NMR measurement quality maps and simulating or estimating tool motion may be used to optimize an NMR pulse sequence, such as at block 718 of FIG. 7. From Eq. 2, motion effect may be reduced by reducing echo spacing $t_E$. However, short $t_E$ demands more electrical power to transmit $B_1$ pulses. If electrical power supply is not sufficient, high electrical demands may cause the droop of $B_1$ amplitude, which may lead to additional signal decay in NMR measurement. In other words, short $t_E$ mitigates motion risk but at a cost of $B^1$ droop risk. This may be mitigated by increasing the flow rate of drilling mud in turbine/alternator that provides electrical power to the tool, but high flow rate could increase tool motion. Under such complex situations, NMR measurement quality maps and simulated or estimated tool motion may be used to make a trade-off between conflicting yet closely coupled objectives.

In another embodiment, NMR measurement quality maps and simulated or estimated tool motion may be used to optimize BHA configurations, such as at block 738 of FIG. 7. For example, an LWD NMR tool may be connected to other tools to configure a BHA, such as BHA 100, that is designed to achieve certain measurement objectives. The other tools may include, but are not limited to, resistivity, nuclear, acoustic, and measurement while drilling (MWD) tools. For a given set of tools, there are some flexibilities in the order in which they are assembled into a BHA. In such an embodiment, BHA motion may be simulated for each configuration with a set of drilling parameters (e.g., WOB, RPM, flow rate), formation and mud properties (e.g., rock strength, friction factor), and well trajectories to cover the expected range of operation. Then, resulting motion may be used to model NMR tool response and associated measurement quality by running a full NMR spin dynamics simulation. It is also possible to estimate NMR measurement quality by overlaying the derived motion properties onto the NMR measurement quality map. In doing so, distribution of motion properties obtained with a unique set of parameters may be stacked together, for example, with appropriate weights reflecting the likelihood of each condition (e.g., 30% of vertical well vs. 70% or horizontal well), in order to obtain a likelihood of motion properties. The tool motion results for each set of motion properties for each BHA configuration may be plotted in a histogram and/or a contour map to represent the likelihood of motion for a given BHA under normal drilling conditions and a particular BHA configuration may be selected from among the multiple BHA candidates based on the priorities for each well.

In another embodiment, NMR measurement quality maps and simulated or estimated tool motion may be used to optimize drilling parameters to ensure acceptable NMR measurement quality, such as at block 739 of FIG. 7. While formation properties and well trajectories are given for each job, BHA configuration and drilling parameters are adjustable to some extent. Therefore, motion properties may be derived for different combinations of drilling parameters and plotted individually on a measurement quality map to determine an operating envelope in which NMR measurement quality is acceptable.

In yet another embodiment, NMR measurement quality maps and simulated or estimated tool motion may be used to diagnose measurement quality by a tool itself or at surface equipment, such as controls system 140, that communicates with a BHA, such as BHA 100, such as at block 759 of FIG. 7. The tool motion properties may come from on-board motion measurement sensors, NMR-based motion estimation, or a combination thereof. The resulting NMR measurement quality estimation information may be transferred to the operator to notify the operator of measurement quality as well as the motion properties to aid in adjusting drilling parameters in real-time.

A few example embodiments have been described in detail above; however, those skilled in the art will readily appreciate that many modifications are possible in the example embodiments without materially departing from the scope of the present disclosure or the appended claims. Accordingly, such modifications are intended to be included in the scope of this disclosure. Likewise, while the disclosure herein contains many specifics, these specifics should not be construed as limiting the scope of the disclosure or of any of the appended claims, but merely as providing information pertinent to one or more specific embodiments that may fall within the scope of the disclosure and the appended claims. Any described features from the various embodiments disclosed may be employed in combination. In addition, other embodiments of the present disclosure may also be devised which lie within the scope of the disclosure and the appended claims. Additions, deletions and modifications to the embodiments that fall within the meaning and scopes of the claims are to be embraced by the claims.

Certain embodiments and features may have been described using a set of numerical upper limits and a set of numerical lower limits. It should be appreciated that ranges including the combination of any two values, e.g., the combination of any lower value with any upper value, the combination of any two lower values, or the combination of any two upper values are contemplated. Certain lower limits, upper limits and ranges may appear in one or more claims below. Numerical values are "about" or "approximately" the indicated value, and take into account experimental error, tolerances in manufacturing or operational processes, and other variations that would be expected by a person having ordinary skill in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include other possible embodiments along with the full scope of equivalents to which such claims are entitled. Accordingly, the claims are not limited by the disclosure.

The invention claimed is:

1. A method for mitigating effects of tool motion on a nuclear magnetic resonance measurement, comprising:
   determining an estimate of motion induced signal loss of nuclear magnetic resonance measurement signals as a function of lateral motion of a tool;
   estimating a velocity and a displacement amplitude of lateral tool motion;
   estimating a nuclear magnetic resonance measurement quality by correlating the velocity and displacement amplitude of the lateral motion and the estimated motion induced signal loss; and
   mitigating an effect of the lateral motion of the tool on the nuclear magnetic resonance measurement by using the estimated nuclear magnetic resonance measurement quality.

2. The method of claim 1, wherein the estimating the velocity and the displacement amplitude of lateral tool motion includes receiving data obtained by motion sensors on a downhole tool.

3. The method of claim 1, wherein the determining the estimate of motion induced signal loss of nuclear magnetic resonance measurement signals as a function of lateral motion of a tool includes generating an estimated nuclear magnetic resonance measurement quality map, the quality map providing an estimate of the nuclear magnetic resonance measurement quality as a function of velocity and displacement amplitude.

4. The method of claim 3, wherein generating an estimated nuclear magnetic resonance measurement quality map includes receiving sample properties of a formation.

5. The method of claim 1, wherein:
   the correlating of the velocity and displacement amplitude of the lateral tool motion includes generating a lookup table, the lookup table including the velocity and the displacement amplitude as reference indexes and the estimated motion induced signal loss as a result.

6. The method of claim 1, wherein the estimating the velocity and displacement amplitude of the lateral tool motion includes:
   executing a bottom hole assembly simulation; and
   determining the velocity and displacement amplitude from the bottom hole assembly simulation.

7. The method of claim 6, wherein executing the bottom hole assembly simulation includes configuring the simulation with at least one combination of drilling parameters and formation properties.

8. The method of claim 1, wherein the estimating the velocity and displacement amplitude of the lateral tool motion includes estimating the velocity and displacement amplitude based on a variation of a magnetic resonance measurement signal from a magnetic resonance measurement tool.

9. The method of claim 1, determining an estimate of motion induced signal loss of nuclear magnetic resonance measurement signals as a function of lateral motion of a tool includes:
   generating an estimated motion induced signal loss as a function of the displacement amplitude and the velocity; and
   generating a curve fit formula for the estimated motion induced signal loss as a function of the displacement amplitude and the velocity of the tool.

10. The method of claim 1, wherein mitigating the effect of the lateral motion of the tool on the nuclear magnetic resonance measurement includes sending an output control signal to a control system of a well site system to adjust drilling parameters of the well site system.

11. The method of claim 1, further comprising:
   receiving one or more criteria for nuclear magnetic resonance measurement quality that includes a measured sample property and a permissible error level for a measurement of the measured sample property; and
   the estimating the nuclear magnetic resonance measurement quality includes generating a nuclear magnetic resonance measurement quality map based on the nuclear magnetic resonance measurement quality, the quality map providing an estimate of the nuclear magnetic resonance measurement quality as a function of velocity and displacement amplitude.

12. The method of claim 11, wherein the measured sample property is at least one of longitudinal relaxation time, transverse relaxation time, or porosity.

\* \* \* \* \*